US008539432B2

(12) United States Patent
Orita

(10) Patent No.: US 8,539,432 B2
(45) Date of Patent: Sep. 17, 2013

(54) COMPUTER PRODUCT, CIRCUIT DESIGN METHOD AND APPARATUS FOR DESIGNING ELECTRONIC APPARATUS IN WHICH MULTIPLE PRINTED-CIRCUIT BOARDS ARE MOUNTED

(75) Inventor: Takahiko Orita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/591,844

(22) Filed: Aug. 22, 2012

(65) Prior Publication Data

US 2013/0132921 A1    May 23, 2013

(30) Foreign Application Priority Data

Nov. 18, 2011   (JP) ................................. 2011-252326

(51) Int. Cl.
*G06F 17/50*   (2006.01)

(52) U.S. Cl.
USPC ........... 716/137; 716/126; 716/129; 716/130; 716/139

(58) Field of Classification Search
USPC .................. 716/126–131, 137, 139
See application file for complete search history.

(56) References Cited

U.S. PATENT DOCUMENTS

| 7,831,948 | B2 * | 11/2010 | Boose | 716/139 |
|---|---|---|---|---|
| 8,214,789 | B2 * | 7/2012 | Boose | 716/139 |
| 8,312,411 | B2 * | 11/2012 | Kumazaki | 716/137 |
| 2003/0025734 | A1 * | 2/2003 | Boose et al. | 345/765 |
| 2010/0005438 | A1 * | 1/2010 | Nakamura | 716/11 |

FOREIGN PATENT DOCUMENTS

| JP | 2001-325315 | 11/2001 |
|---|---|---|
| WO | WO-2008/047650 | 4/2008 |

* cited by examiner

*Primary Examiner* — Nha Nguyen
(74) *Attorney, Agent, or Firm* — Fujitsu Patent Center

(57) ABSTRACT

A computer-readable recording medium stores a program that causes a computer to execute a circuit design process. The process includes selecting component data in first board data from among the first board data including first connector component data and second board data including second connector component data that is associated with the first connector component data; setting a connection destination net name of the selected component data to a first vacant terminal of the first connector component data; and setting the connection destination net name of the component data to a second vacant terminal of the second connector component data that corresponds to the first vacant terminal of the first connector data when the component data is moved from the first board data to the second board data.

5 Claims, 24 Drawing Sheets

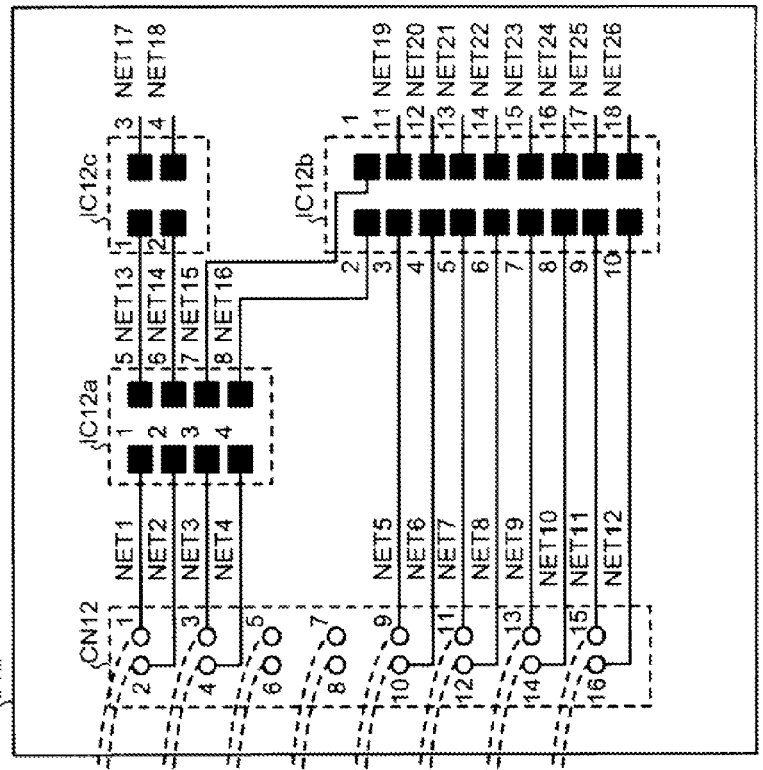
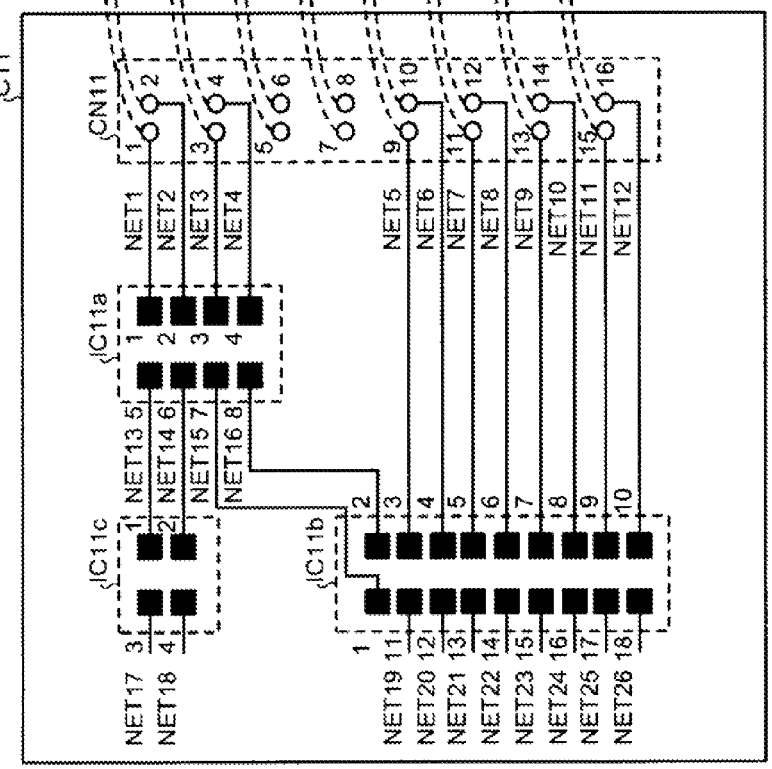
FIG.6

FIG.10
1 (C11, IC11a.1, NET1, CN11.1), (C12, CN12.1, NET1)
2 (C11, IC11a.2, NET2, CN11.2), (C12, CN12.2, NET2)
3 (C11, IC11a.3, NET3, CN11.3), (C12, CN12.3, NET3)
4 (C11, IC11a.4, NET4, CN11.4), (C12, CN12.4, NET4)
FIG.11
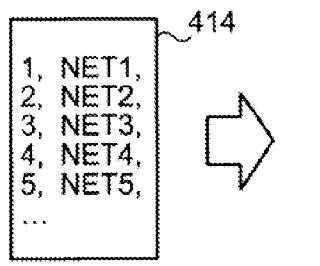
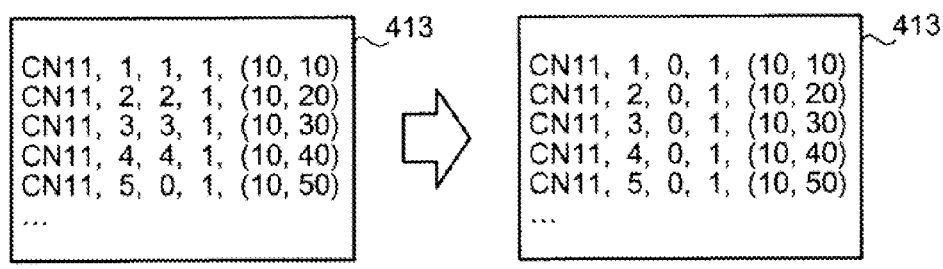

FIG.18
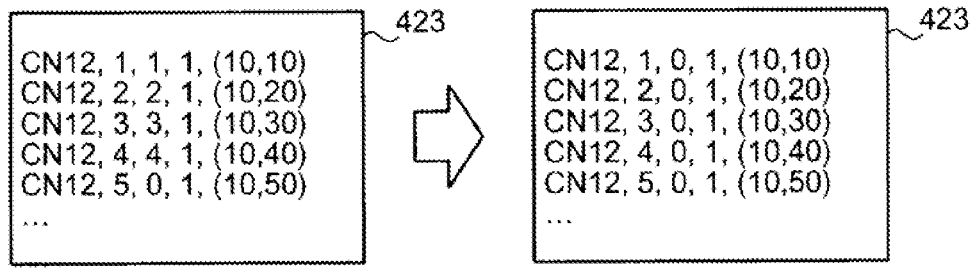
FIG.19
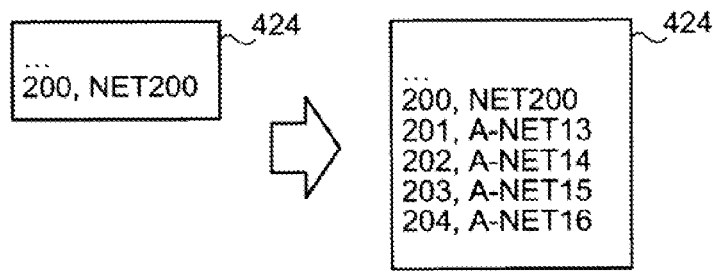
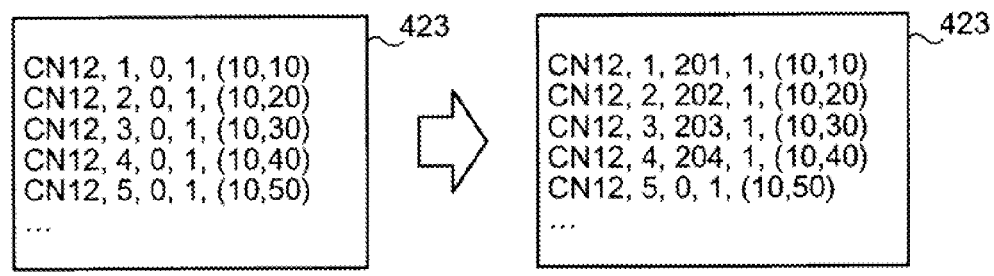

FIG.21
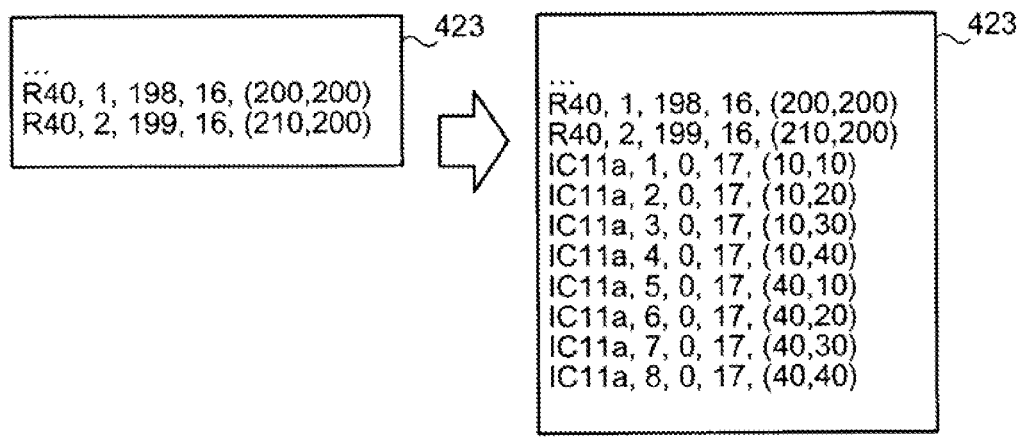
FIG.22
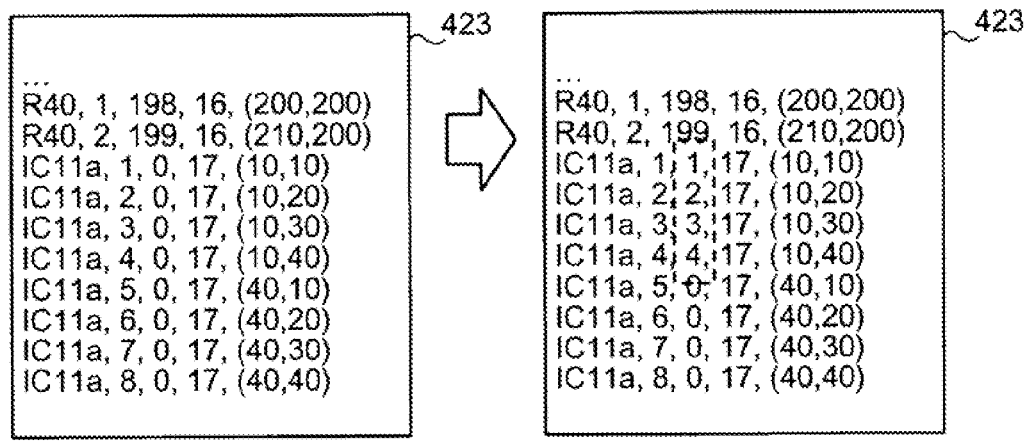

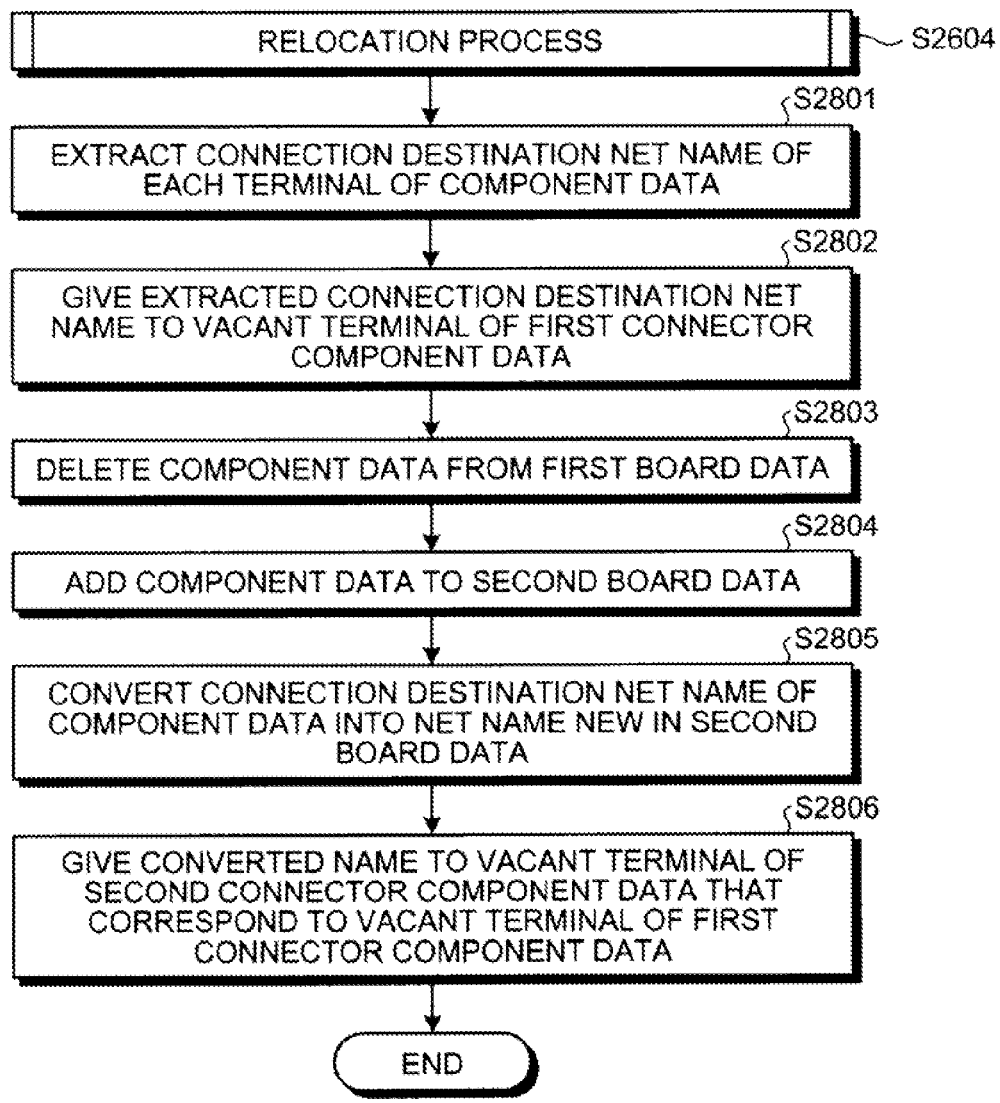

us 8,539,432 B2

COMPUTER PRODUCT, CIRCUIT DESIGN METHOD AND APPARATUS FOR DESIGNING ELECTRONIC APPARATUS IN WHICH MULTIPLE PRINTED-CIRCUIT BOARDS ARE MOUNTED

CROSS REFERENCE TO RELATED APPLICATIONS

This application is based upon and claims the benefit of priority of the prior Japanese Patent Application No. 2011-252326, filed on Nov. 18, 2011, the entire contents of which are incorporated herein by reference.

FIELD

The embodiments discussed herein are related to a circuit design program, a circuit design method, and a circuit design apparatus.

BACKGROUND

An electronic apparatus is made up of the combination of printed-circuit boards on which various electronic devices are mounted. For example, a printed-circuit board in an electronic apparatus such as a mobile terminal and a small personal computer (PC) may be divided into two or more printed-circuit boards because the size of the electronic apparatus is restricted. Multiple printed-circuit boards are mounted in an electronic apparatus such as a folding type handset or a sliding type handset. A designer of the electronic apparatus designs the electronic apparatus, determining on which printed-circuit board each component is mounted.

As a related art, Japanese Laid-open Patent Publication No. 2001-325315 discloses the confirmation of a signal path between printed-circuit boards. International Publication Pamphlet No. 2008/047650 discloses parallel designing of printed-circuit boards by putting together design information about the printed-circuit boards of an electronic apparatus.

The logical relationship between component data is indicated by a net name but when a pair of circuit boards with board data is given, the net name is defined at each board data. If component data is moved from one group of board data to another group, a connection destination expressed by the net name of the component data changes. Thus, there is a problem that the movement of component data between board data of a pair of circuit board cannot maintain the logical relationship.

SUMMARY

According to an aspect of an embodiment, a computer-readable recording medium stores a program that causes a computer to execute a circuit design process. The process includes selecting component data in first board data from among the first board data including first connector component data and second board data including second connector component data that is associated with the first connector component data; setting a connection destination net name of the selected component data to a first vacant terminal of the first connector component data; and setting the connection destination net name of the component data to a second vacant terminal of the second connector component data that corresponds to the first vacant terminal of the first connector data when the component data is moved from the first board data to the second board data.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a diagram depicting another example of the first board data C11 and the second board data C12 in the form of mounting design data;

FIG. 10 is a diagram depicting one example of an acquired result;

FIG. 11 is a diagram depicting an example of deletion of unnecessary nets (Part I);

FIG. 16 is a diagram depicting an example of the deletion of component data IC11a;

FIG. 18 is a diagram depicting an example of the labeling of second terminals (Part I);

FIG. 19 is a diagram depicting an example of the labeling of the second terminals (Part II);

FIG. 21 is a diagram depicting an example of the addition of component data IC11a;

FIG. 22 is a diagram depicting net allocation to the relocated component data IC11a (Part I);

FIG. 28 is a flowchart of the relocation process (step S2604) of FIG. 26.

DESCRIPTION OF EMBODIMENTS

Preferred embodiments of the present invention will be explained with reference to the accompanying drawings. However, before a circuit design program, a circuit design method, and a circuit design apparatus according to the embodiments are explained, the designing of a printed-circuit board is briefly mentioned. The circuit design by use of a computer aided design (CAD) handles one circuit diagram data to describe the logical relationship between components mounted on printed-circuit boards or handles one circuit diagram for one printed-circuit board. In the latter case, a name of a component and a net name that expresses the logical relationship between components are defined at each circuit diagram. For this reason, if a component is moved from one circuit diagram to another, the connection destination changes where the connection destination is designated by the net name that is given to the component. As a result, a designer has to change or delete a net name manually in order to maintain the logical connection relationship in circuit diagrams between a pair of circuit boards.

Further, in the latter case, circuit diagram data that express the logical connection relationship between components mounted in a printed-circuit board corresponds, one to one, to mounting design data that expresses wire and component arrangements. In the mounting design data like the circuit diagram data, the names of components and net names that express the logical connection relationship between components are defined for each mounting design. Thus, if a designer moves components between a pair of circuit diagrams, an adding or deleting process is required not only for the circuit diagram but also for the mounting design. The designer repeatedly changes the circuit diagram data and the mounting design data to determine which component is placed on which printed-circuit board. Manual work consumes time and requires effort and it is possible that the logical connection relationship cannot be maintained when a net connection is lost after component data is moved.

According to the embodiments, even when component data is moved between a pair of circuit diagram (data) or between a pair of mounting design data, the logical connection relationship is maintained.

Figure 1:
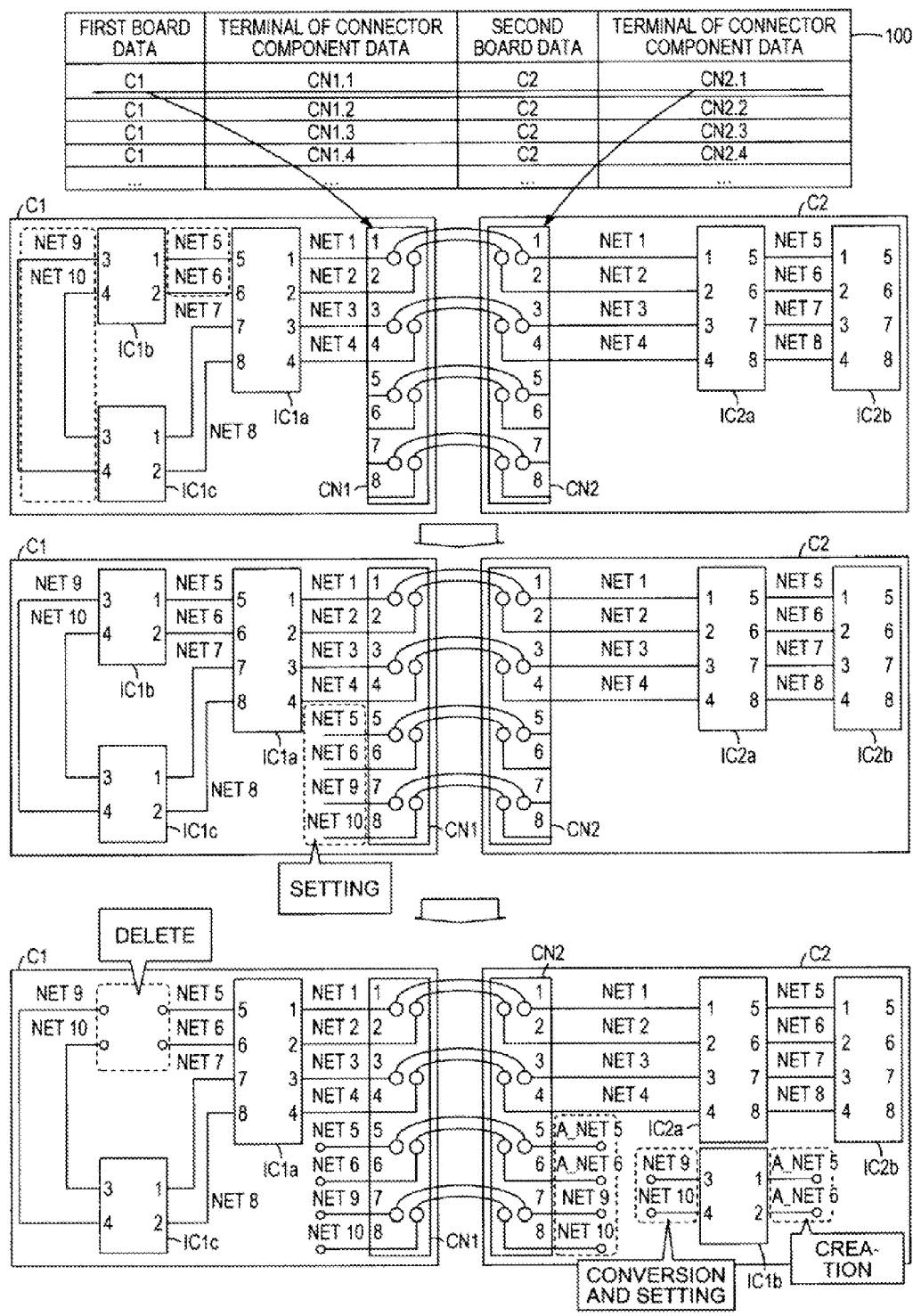
FIG. 1 is a diagram depicting an example of operation of the embodiments.

FIG. 1 is a diagram depicting one operation example of the embodiments. For example, a first board data C1 includes component data IC1a, component data IC1b, component data IC1c, and a first connector component data CN1. For example, a second board data C2 includes component data IC2a, component data IC2b, a second connector component data CN2 that is associated with the first connector component data CN1. The first board data C1 and the second board data C2 are stored in a storage device that the circuit design apparatus can access. Connection condition data 100 represents the logical connection relationship between the first connector component data CN1 and the second connector component data CN2.

A terminal of each component data in the first board data C1 and the second board data C2 stores a connection destination net name. Identical connection destination names mean that terminals of component data are connected. When a connection destination name is not set to a terminal of the connector component data CN1, CN2, the terminal is a vacant terminal. A terminal of each component data is expressed by "component data. terminal number". For instance, terminals of the first connector component data CN1 are expressed as CN1.1 to CN1.8.

The circuit design apparatus selects component data IC1b that is present in the first board data C1. A designer inputs, via an input unit, an instruction to the circuit design apparatus that component IC1b is to be moved from the first board data C1 to the second board data C2. The input unit will be explained later. The circuit design apparatus receives the instruction and selects component data IC1b from the first board data C1.

The circuit design apparatus sets the connection destination net name of component data IC1b to a first vacant terminal of the first connector component data CN1. For example, the circuit design apparatus extracts connection destination net names NET5, NET6, NET9, and NET10 of the terminals IC1b.1 to 4 of component data IC1b. The circuit design apparatus finds a first vacant terminal, a terminal without a connection destination net name among terminals of the first connector component data CN1. In this case, the first vacant terminals are CN1.5 to 8. The circuit design apparatus sets the connection destination net names NET5, NET6, NET9, and NET10 to the first vacant terminals CN1.5 to 8 as the connection destination net name of the first vacant terminals.

The circuit design apparatus moves the component data IC1b from the first board data C1 to the second board data C2. For example, the circuit design apparatus deletes the component data IC1b from the first board data C1 and creates the component data IC1b in the second board data C2. In this way, the component data IC1b is moved from the first board data C1 to the second board data C2. The circuit design apparatus sets the connection destination net names NET9 and NET10 of the component data IC1b to the second vacant terminals CN2.7 and 2.8 of the second connector component data CN2 that corresponds to the first vacant terminals CN1.7 and 1.8 of the first connector component data CN1.

In FIG. 1, identical connection destination net names NET5 and NET6 are present at the terminals of component data IC2a and component data IC2b in the second board data C2. Under this situation, the circuit design apparatus converts the names NET5 and NET6 into different net names, A-NET5 and A-NET6. The circuit design apparatus sets the net names A-NET5 and A-NET6 to the second vacant terminals CN2.5 and 2.6 that correspond to the first vacant terminals CN1.5 and 1.6.

When the first board data C1 and second board data C2 are circuit diagram data, and identical net names are apart on a diagram, the circuit design apparatus may associate the identical net names with each other by coupling terminal data. When the first board data C1 and the second board data C2 are mounting design data, the circuit design apparatus may relocate or rearrange wires and components by calling an automatic components and wires arrangement process of the mounting design CAD.

In this way, the component data IC1b is moved from the first board data C1 to the second board data C2 without destroying the logical connection relationship of components.

Figure 2:
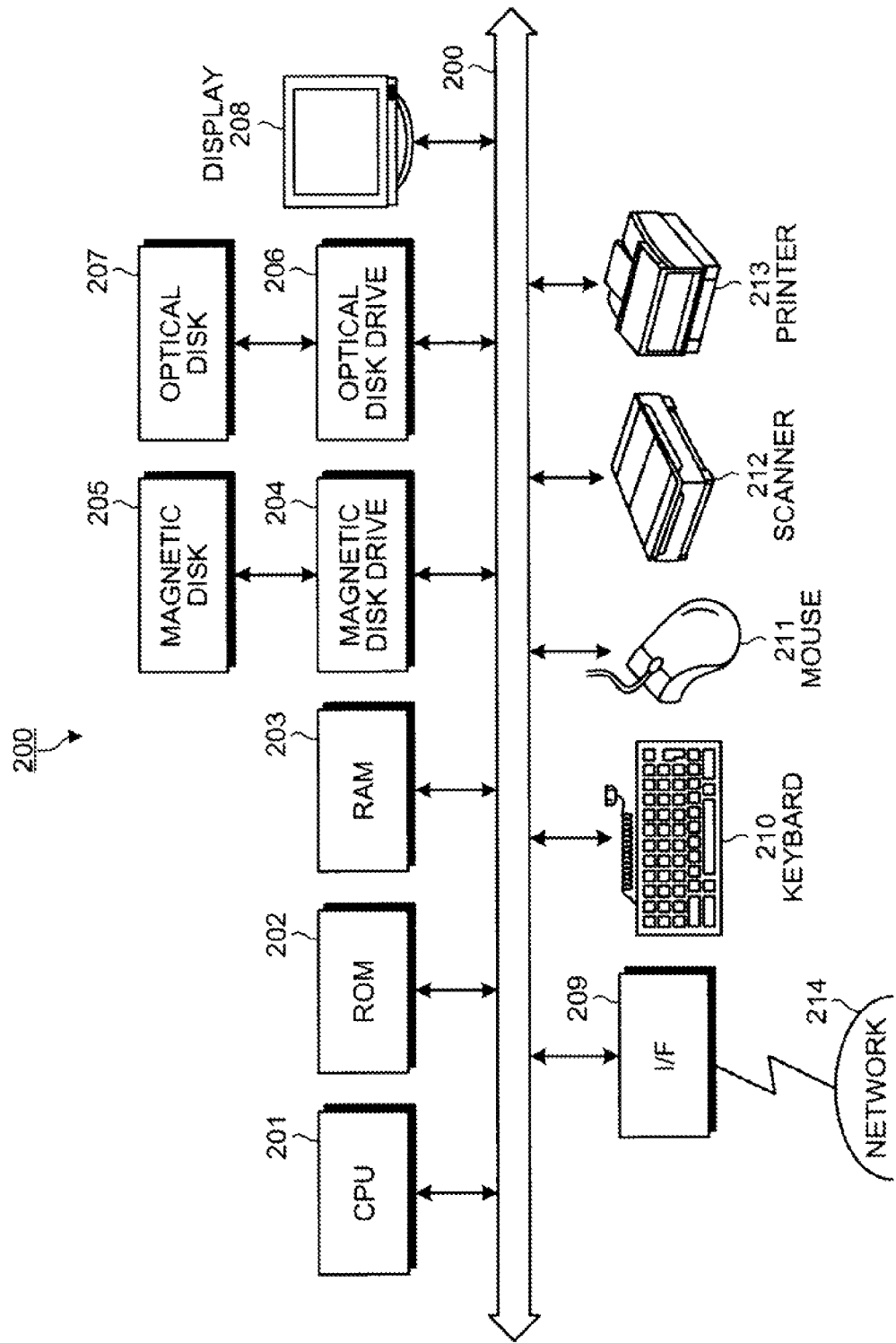
FIG. 2 is a block diagram depicting an example of a hardware configuration of a circuit design apparatus according to the embodiments.

FIG. 2 is a block diagram depicting an example of a hardware configuration of the circuit design apparatus according to the embodiments. In FIG. 2, a circuit design apparatus 200 includes a central processing unit (CPU) 201, a read-only memory (ROM) 202, a random access memory (RAM) 203, a magnetic disk drive 204, a magnetic disk 205, an optical disk drive 206, an optical disk 207, a display 208, an interface (I/F) 209, a keyboard 210, a mouse 211, a scanner 212, and a printer 213, respectively connected by a bus 215.

The CPU 201 governs overall control of the circuit design apparatus 200. The ROM 202 stores therein programs such as a boot program. The RAM 203 is used as a work area of the CPU 201. The magnetic disk drive 204, under the control of the CPU 201, controls the reading and writing of the data with respect to the magnetic disk 205. The magnetic disk 205 stores therein the data written under control of the magnetic disk drive 204.

The optical disk drive 206, under the control of the CPU 201, controls the reading and writing of data with respect to the optical disk 207. The optical disk 207 stores therein the data written under control of the optical disk drive 206, the data being read by a computer.

The display 208 displays, for example, data such as text, image, functional information, etc., in addition to a cursor, icons, and/or tool boxes. A cathode ray tube (CRT), a thin-film-transistor (TFT) liquid crystal display, a plasma display, etc., may be employed as the display 208.

The I/F 209 is connected to a network 214 such as a local area network (LAN), a wide area network (WAN), and the Internet through a communication line and is connected to other apparatuses through the network 214. The I/F 209 administers an internal interface with the network 214 and controls the input/output of data from/to external apparatuses. For example, a modem or a LAN adaptor may be employed as the I/F 209.

The keyboard 210 includes, for example, keys for inputting letters, numerals, and various instructions and performs the input of data. Alternatively, a touch-panel-type input pad or numeric keypad, etc. may be adopted. The mouse 211 is used to move the cursor, select a region, or move and change the size of windows. A track ball or a joy stick may be adopted provided each respectively has a function similar to a pointing device.

The scanner 212 optically reads an image and takes in the image data into the circuit design apparatus 200. The scanner 212 may have an optical character reader (OCR) function as well. The printer 213 prints image data and text data. The printer 213 may be, for example, a laser printer or an ink jet printer.

Examples of the first and the second board data are circuit diagram data that provides the connection relationship, and mounting design data that provides arrangement of components and wires as well as the connection relationship. Examples of the circuit diagram data and mounting design data, and a detailed example of connection condition data are explained. In the explanation below, the first board data is called C11 and the second board data is called C12.

Figure 3:
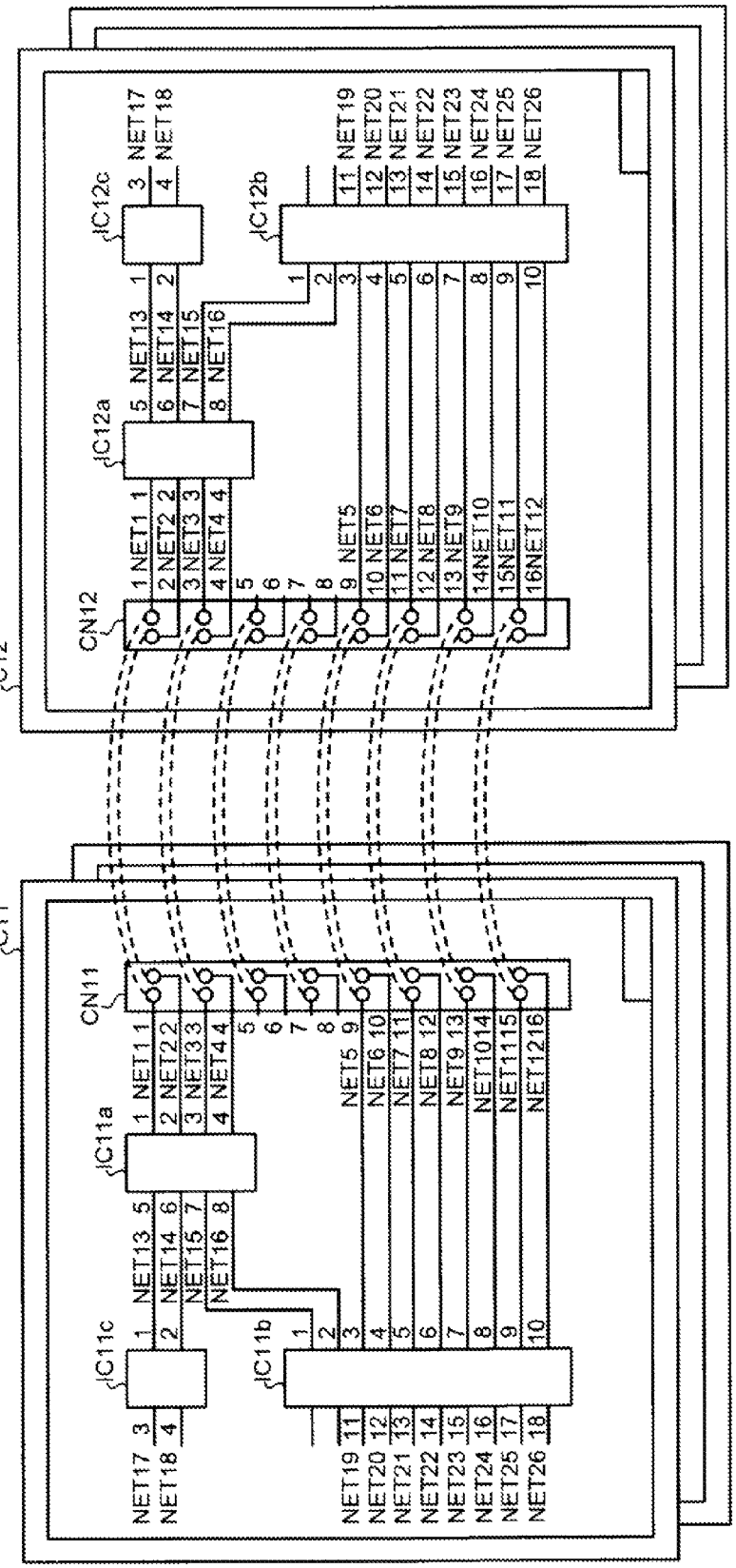
FIG. 3 is a diagram depicting an example of first board data C11 and second board data C12 in the form of circuit diagram data.

FIG. 3 is a diagram depicting an example of the first board data C11 and the second board data C12 in the form of the circuit diagram data. The first board data C11 and the second board data are connected via the first connector component data CN11 and the second connector component data CN12. The connection relationship between the first connector component data CN11 and the second connector component data C12 is described in the connection condition data which is explained later.

The first board data C11 includes component data IC11a to c and the first component data CN11. Terminals 1-4 of the component data IC11a and terminals 1-4 of the first connector component data CN11 have connection destination net names NET1 to NET4 respectively. Terminals 5 and 6 of the component data IC11a and terminals 1 and 2 of the component data IC11c have connection destination net names NET13 and NET14 respectively. Terminals 7 and 8 of the component data IC11a and terminals 1 and 2 of the component data IC11b have connection destination net names NET15 and NET16 respectively. Terminals 9-16 of the first connector component data CN11 and terminals 3-10 of the component data IC11b have connection destination net names NET5 to NET12 respectively. Terminals 11-18 of the component data IC11b have connection destination net names NET19 to NET26 respectively. Terminals 3 and 4 of the component data IC11c have connection destination net names NET17 and NET18 respectively. No connection destination net names are set to terminals 5-8 of the first connector component data CN11 and thus the terminals 5-8 of the first connector component data CN11 are vacant terminals.

The second board data C12 includes component data IC12a to c and the second connector component data CN12. Terminals 1-4 of the component data IC12a and terminals 1-4 of the second connector component data CN12 have connection destination net names NET1 to NET4 respectively. Terminals 5 and 6 of the component data IC12a and terminals 1 and 2 of the component data IC12c have connection destination net names NET13 and NET14 respectively. Terminals 7 and 8 of the component data IC12a and terminals 1 and 2 of the component data IC12b have connection destination net names NET15 and NET16 respectively. Terminals 3-10 of the component data IC12b and terminals 9-16 of the second connector component data CN12 have connection destination net names NET5 to NET12 respectively. Terminals 11-18 of the component data IC12b have connection destination net names NET19 to NET26 respectively. Terminals 3 and 4 of the component data IC12c have connection destination net names NET17 and NET18 respectively. No connection destination net names are set to terminals 5-8 of the second connector component data CN12 and thus terminals 5-8 of the second connector component data CN12 are vacant terminals.

Identical net names may be given to the first board data C11 and the second board data C12 because these two groups of data belong to different boards.

The first board data C11 in FIG. 3 is a diagram drawn by a CAD tool. The first board data C11 and the second board data C12 have a data structure as depicted in FIG. 4 and FIG. 5.

Figure 4:
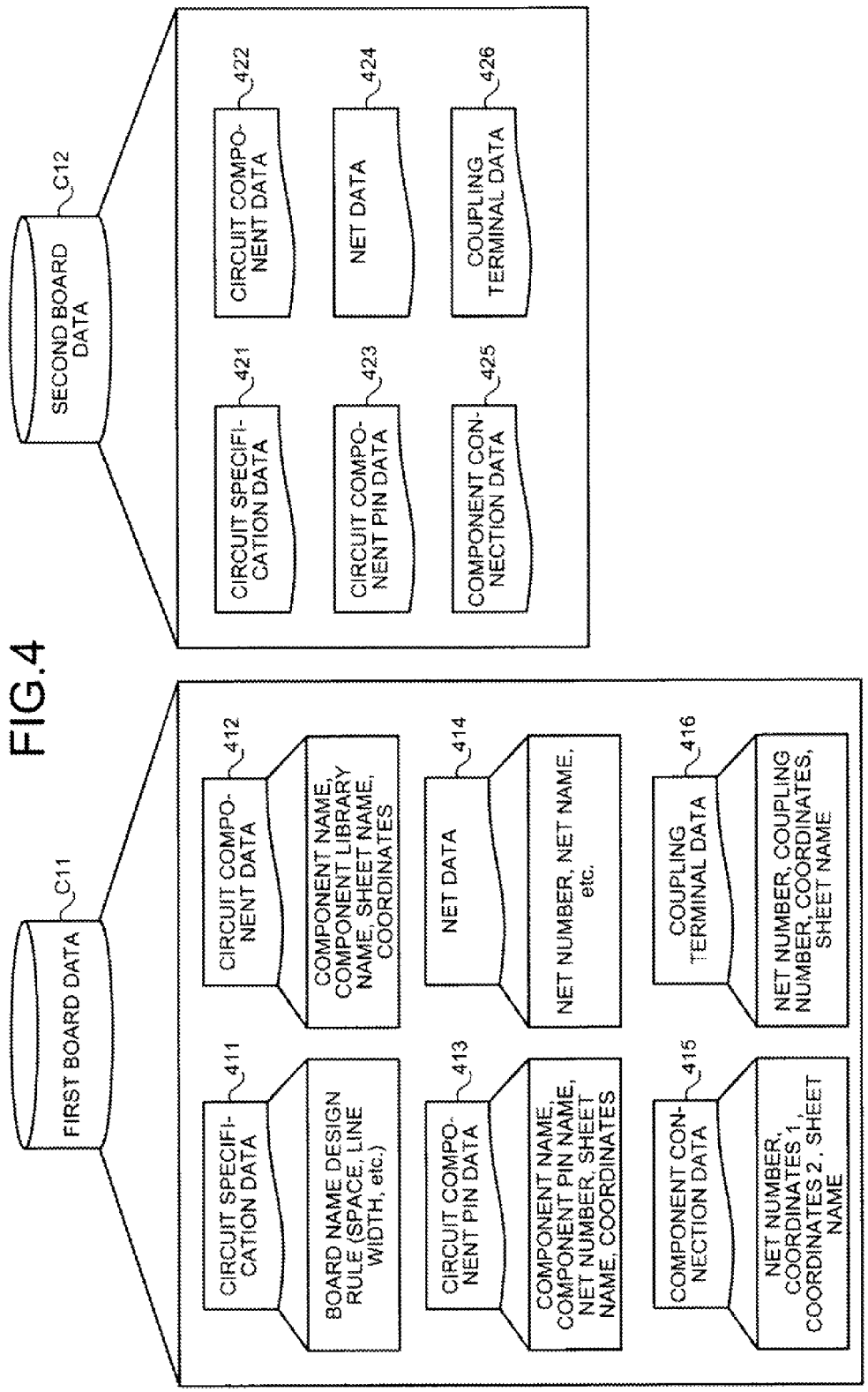
FIG. 4 is a diagram depicting a data structure concerning circuit diagram data (Part I)
Figure 5:
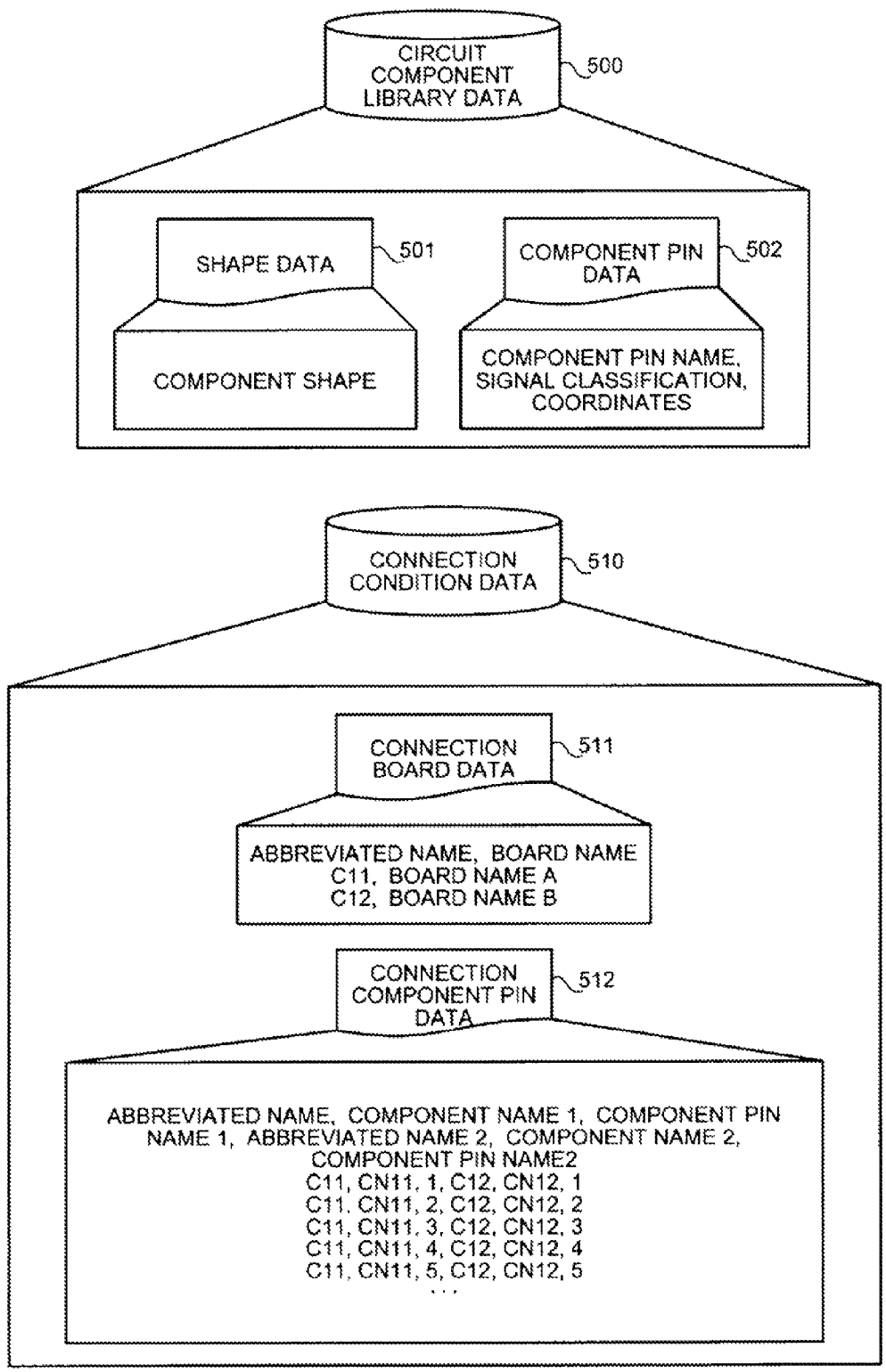
FIG. 5 is a diagram depicting a data structure concerning circuit diagram data (Part II)

FIG. 4 and FIG. 5 are diagrams depicting data structures concerning circuit diagram data. The first board data C11 includes, for example, circuit specification data 411, circuit component data 412, circuit component pin data 413, net data 414, component connection data 415, and coupling terminal data 416. The second board data C12 includes, for example, circuit specification data 421, circuit component data 422, circuit component pin data 423, net data 424, component connection data 425, and coupling terminal data 426.

A board name and a design rule are set to the circuit specification data 411 and the circuit specification data 421. The design rule is, for example, space and the width of an interconnection.

A component name, a component library name, a sheet name, and coordinates are set to the circuit component data 412 and the circuit component data 422.

A component name, a component pin name, a net number, a sheet name, and coordinates are set to the circuit component pin data 413 and the circuit component pin data 423. A terminal number of a component is set to the component pin name.

A net number and a net name are set to the net data 414 and the net data 424. In the circuit diagram data, a net number is given to each net name.

A net number, coordinates 1, coordinates 2 and a sheet name are set to the component connection data 415 and the component connection data 425. Namely, the length of a net that is obtained from the component connection data 415, the component connection data 425, and the net number is set.

A net number, a coupling number, coordinates, and a sheet name are set to the coupling terminal data 416 and the coupling terminal data 426. The coupling terminal is a terminal for coupling nets having identical net numbers even if the nets are disconnected.

In the embodiments, the net number set to the circuit component pin data 413 or the circuit component pin data 423 indicates that the connection destination net name is set to terminals of each component. In the embodiments, the same name is not given to component data items.

Circuit component library data 500 includes shape data 501 and component pin data 502. The shape of a component is set to the shape data 501. For example, a quadrilateral and the length of sides may be set as the shape of a component. A component pin name, a signal classification, and coordinates are set to the component pin data 502. Terminal numbers of each component are set to the component pin name. The signal classification sorts terminals into terminals for an input signal, terminals for an output signal, and terminals for input and output signals.

Connection condition data 510 includes connection board data 511 and connection component pin data 512. An abbreviated name and a board name are set to the connection board data 511. In FIG. 5, an abbreviated name matches the reference sign of board data. The board name of the first board data C11 is board A. The board name of the second board data C12 is board B.

An abbreviated name, component name 1, component pin name 1, abbreviated name 2, component name 2, and component pin name 2 are set to the connection component pin data 512. The connection component pin data 512 indicates that a terminal expressed by the component pin name 1 is connected to a terminal expressed by the component pin name 2. For example, the connection component pin data 512 teaches that the terminal 1 of the first connector component data CN11 in the first board data C11 is connected to the terminal 1 of the second connector component data CN12 in the second board data C12.

The circuit component data 412 and the circuit component pin data 413 are associated by the component name. The circuit component data 422 and the circuit component pin data 423 are associated by the component name. The circuit component pin data 413, the net data 414, the component connection data 415, and the coupling terminal data 416 are associated by the net number. The circuit component pin data 423, the net data 424, the component connection data 425, and the coupling terminal data 426 are associated by the net number.

The connection condition data 510 and the first board data C11 are associated by the board name. The connection condition data 510 and the second board data C12 are associated by the board name. The first board data C11 specifies the circuit component library data 500 by use of the circuit component data 412. The second board data C12 specifies the circuit component library data 500 by use of the circuit component data 422.

Coordinates mentioned in FIG. 4 and FIG. 5 indicate a position on a circuit form and are unrelated to the physical coordinates of a board.

The first board data C11, the second board data C12, the circuit component library data 500, and the connection condition data 510 are stored in a storage device such as the RAM 203, the magnetic disk 205, and the optical disk 207.

FIG. 6 is a diagram depicting another example of the first board data C11 and the second board data C12 in the form of the mounting design data. The first board data C11 and the second board data C12 depicted in FIG. 6 include information on physical arrangements as well as the logical connection relationship. The component data of the first board data C11 and the second board data C12, and the connection destination net name given to each component data are identical to those in FIG. 3 and thus the explanation thereof will be omitted.

Figure 7:
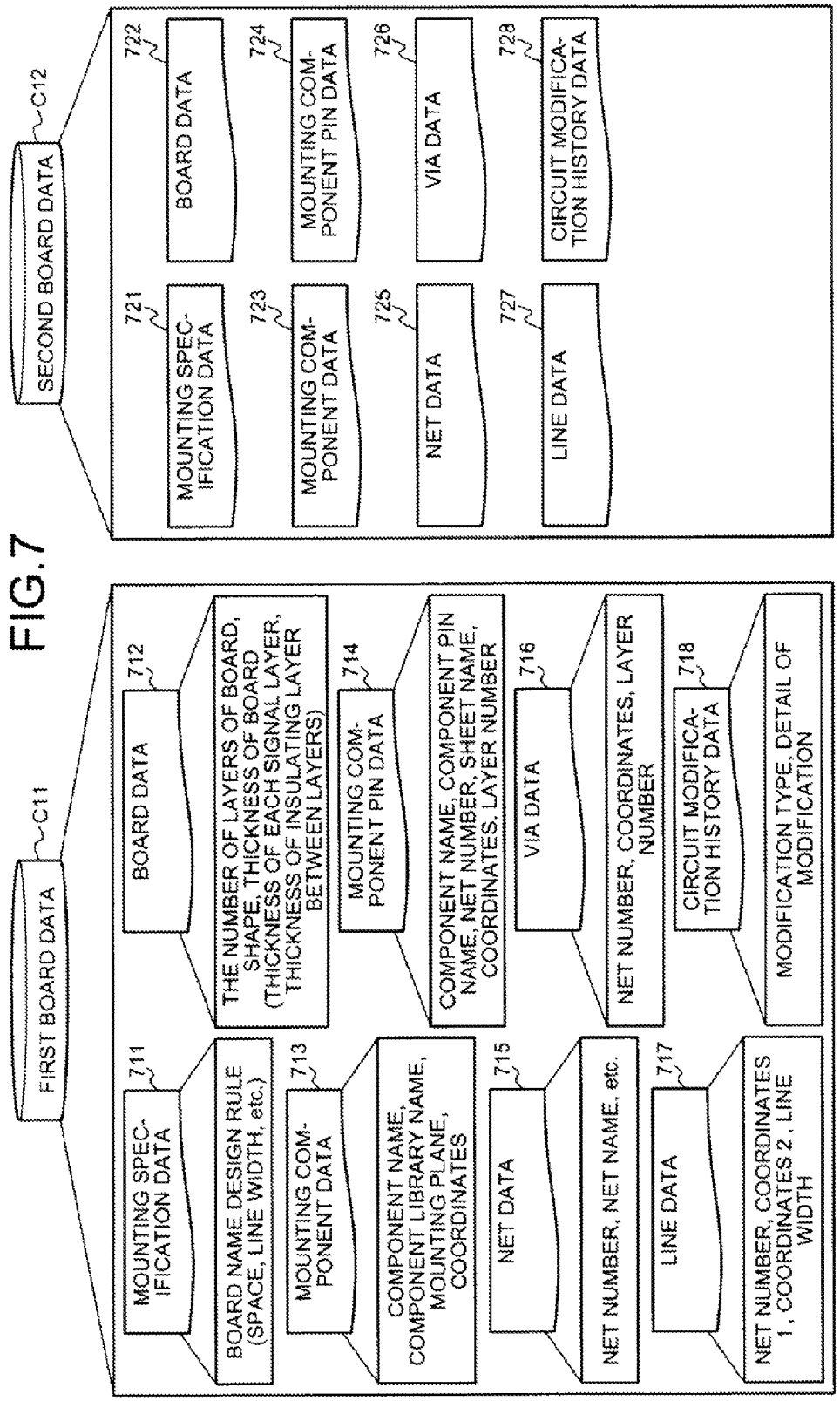
FIG. 7 is a diagram depicting an example of data structure in the form of mounting design data (Part I)
Figure 8:
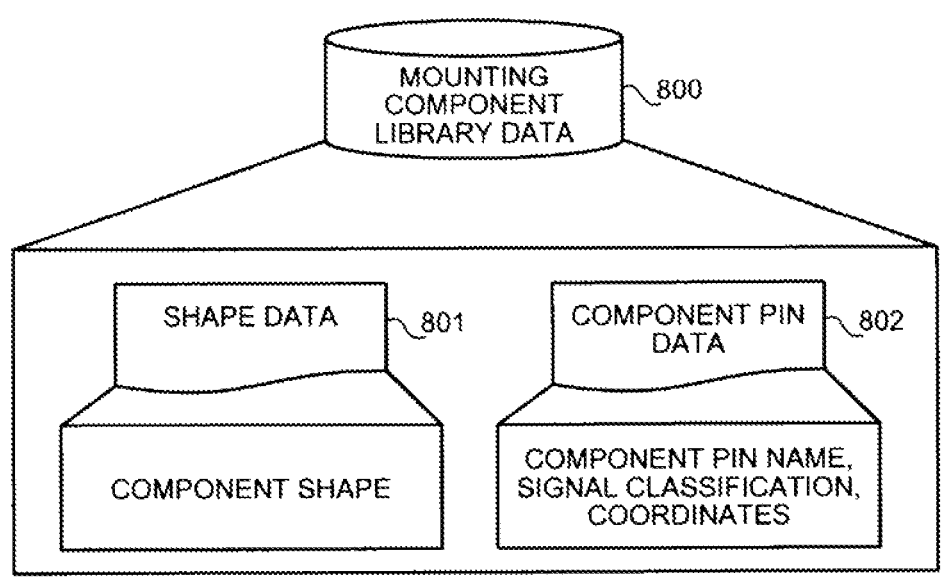
FIG. 8 is a diagram depicting an example of data structure in the form of mounting design data (Part II)

FIG. 7 and FIG. 8 are diagrams depicting an example of data structure in the form of the mounting design data. The first board data C11 includes mounting specification data 711, board data 712, mounting component data 713, mounting component pin data 714, net data 715, via data 716, line data 717, and circuit modification history data 718. The second board data C12 includes mounting specification data 721, board data 722, mounting component data 723, mounting component pin data 724, net data 725, via data 726, line data 727, and circuit modification history data 728.

As an example, a board name and a design rule are set to the mounting specification data 711 and the mounting specification data 721. The design rule is, for example, space and the width of an interconnection. As an example, the number of layers of a board, the shape, and the thickness of a board are set to the board data 712 and the board data 722. The thickness of a board indicates, for example, the thickness of each signal line or the thickness of an insulating layer between layers.

As an example, a component name, a component library name, a mounting plane, and coordinates of components are set to the mounting component data 713 and the mounting component data 723. As an example, a component name, a component pin name, a net number, a sheet name, coordinates, and a layer number are set to the mounting component pin data 714 and the mounting component pin data 724.

A net number, a net name, and so on are set to the net data 715 and the net data 725. A net number, coordinates, and a layer number are set to the via data 716 and the via data 726. A net number, coordinates 1, coordinates 2, and the line width are set to the line data 717 and the line data 727. A modification type and the details of modification are set to the circuit modification history data 718 and the circuit modification history data 728.

The mounting component library data 800 includes shape data 801 and component pin data 802. A shape of a component is set to the shape data 801. A component pin name, a signal classification, and coordinates are set to the component pin data 802.

The mounting component data 713 and the mounting component pin data 714 are associated by the component name. The mounting component data 723 and the mounting component pin data 724 are associated by the component name. The mounting component pin data 714, the net data 715, the via data 716, and the line data 717 are associated by the net number. The mounting component pin data 724, the net data 725, the via data 726, and the line data 727 are associated by the net number.

Coordinates in FIG. 7 are coordinates of a physical board but coordinates in FIG. 8 are the position in a circuit form, unrelated to the coordinates of the physical board. The connection condition data 510 are not shown because the connection condition data 510 are the same whether the circuit diagram data or the mounting design data is being dealt with.

The first board data C11, the second board data C12, and the mounting component library data 800 are stored in a storage device such as the RAM 203, the magnetic disk 205, and the optical disk 207.

Figure 9:
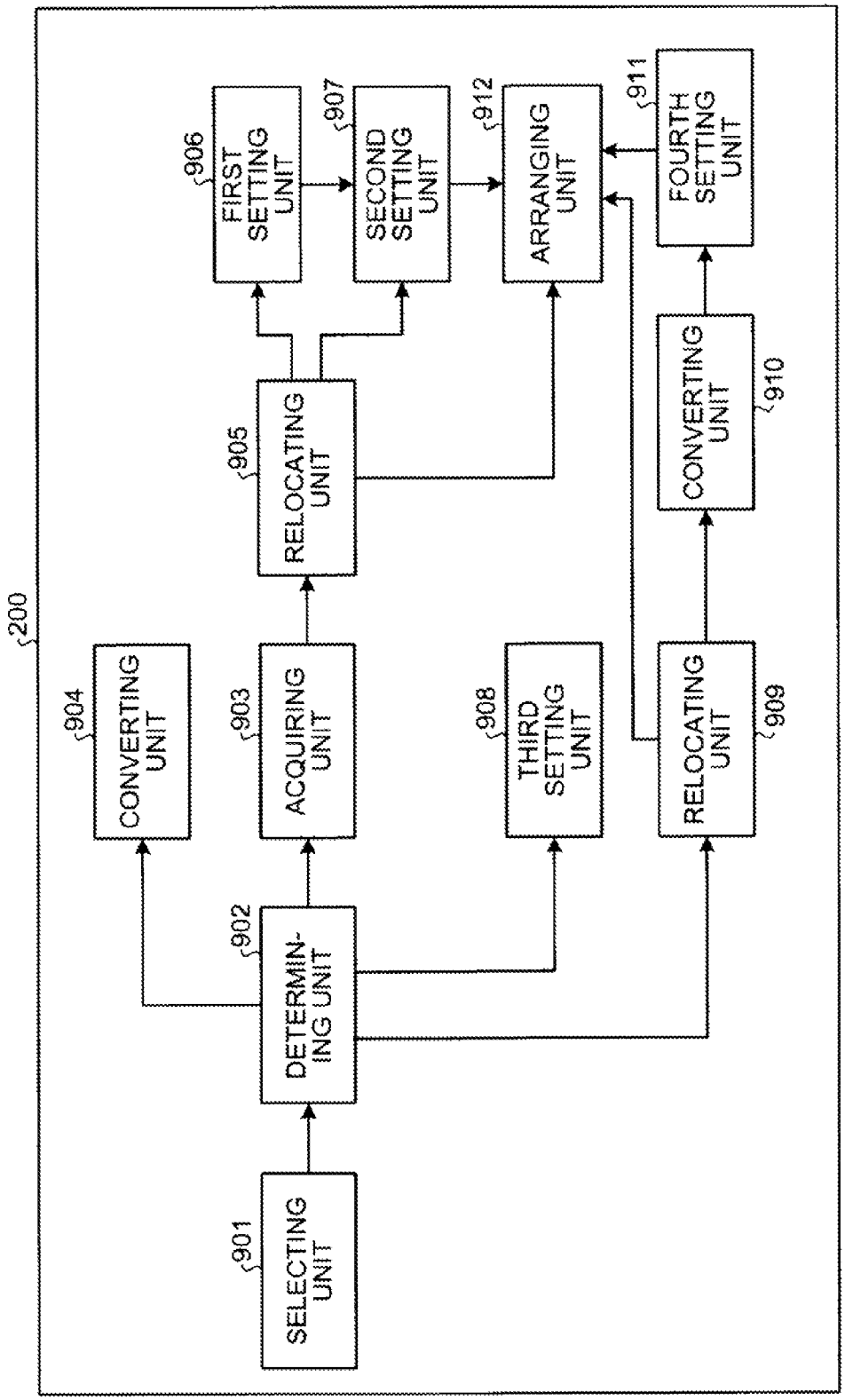
FIG. 9 is a block diagram depicting a functional configuration of a circuit design apparatus 200.

FIG. 9 is a block diagram depicting a functional configuration of a circuit design apparatus 200. The circuit design apparatus 200 includes a selecting unit 901, a determining unit 902, an acquiring unit 903, a converting unit 904, a relocating unit 905, a first setting unit 906, and a second setting unit 907. The circuit design apparatus 200 further includes a third setting unit 908, a relocating unit 909, a converting unit 910, a fourth setting unit 911, and an arranging unit 912.

The processes of the selecting unit 901 to the arranging unit 912 are coded in an analysis program stored in a storage device such as the ROM 202, the RAM 203, the magnetic disk 205, and the optical disk 207. The CPU 201 reads out a circuit design program from a storage device and executes a process coded in a circuit design program and as a result, the processes of the selecting unit 901 to the arranging unit 912 are realized. The CPU 201 may read out a circuit design program from the network 214 through the I/F 209.

An embodiment where the first board data C11 and the second board data C12 are circuit diagram data is explained.

The selecting unit 901 selects component data that is present in the first board data C11. Suppose that component data IC11a is selected. A designer inputs, by means of the inputting unit, an instruction into the circuit design apparatus 200 that the component data IC11a be moved from the first board data C11 to the second board data C12. The input unit may be the keyboard 210 or the mouse 211. An instruction that the component data IC11a be moved from the first board data C11 to the second board data C12 may be stored in a storage device such as the ROM 202, the RAM 203, the magnetic disk 205, and the optical disk 207. For example, the selecting unit 901 selects the component data IC11a in the first board data C11 based on the instruction of moving the component data IC11a.

The determining unit 902 determines whether the connection destination net name of a terminal of the component data IC11a is identical to the connection destination net name of a terminal (first terminal) of the first connector component data CN11. In this example, the determining unit 902 determines that the connection destination net names of terminals 1-4 of the component data IC11a are identical to the connection destination net names of terminals 1-4 of the first connector component data CN11. The first terminals are terminals 1-4 of the first connector component data CN11.

The acquiring unit 903 acquires, when the determining unit 902 determines that they are identical, the connection destination net name of the second terminal of the second connector component data CN12 that corresponds to the first terminals.

For example, the acquiring unit 903 acquires from the connection condition data 510 terminals 1-4 of the second connector component data CN12 that are connected to the first terminals. The second terminals are terminals 1-4 of the second connector component data CN12. The acquiring unit 903 acquires from the second board data C12 the connection destination net names set to the second terminals.

FIG. 10 is a diagram depicting one example of the acquired result. The acquired result includes an identification number, a set of (source board data, pin number of source component data, net name, pin number of connector component data), and a set of (destination board data, pin number of destination connector component data, net name). For example, when the identification number is #1, the source board data is C11 and the pin number of source component data is IC11a.1. The reference sign of IC11a.1 indicates terminal 1 of the component data IC11a. The net name set to the IC11a.1 is NET1. The connection destination net name set to CN11.1 is NET1. The reference sign of CN11.1 indicates terminal 1 of the first connector component data CN11. The acquired result 1000 is stored in a storage device such as the ROM 202, the RAM 203, the magnetic disk 205, and the optical disk 207.

The converting unit 904 converts the connection destination net names of the first terminals to ones of the component data IC11a that are not connected to the first connector component data CN11. The converting unit 904 will be explained in detail with reference to FIG. 11 to FIG. 15.

Figure 12:
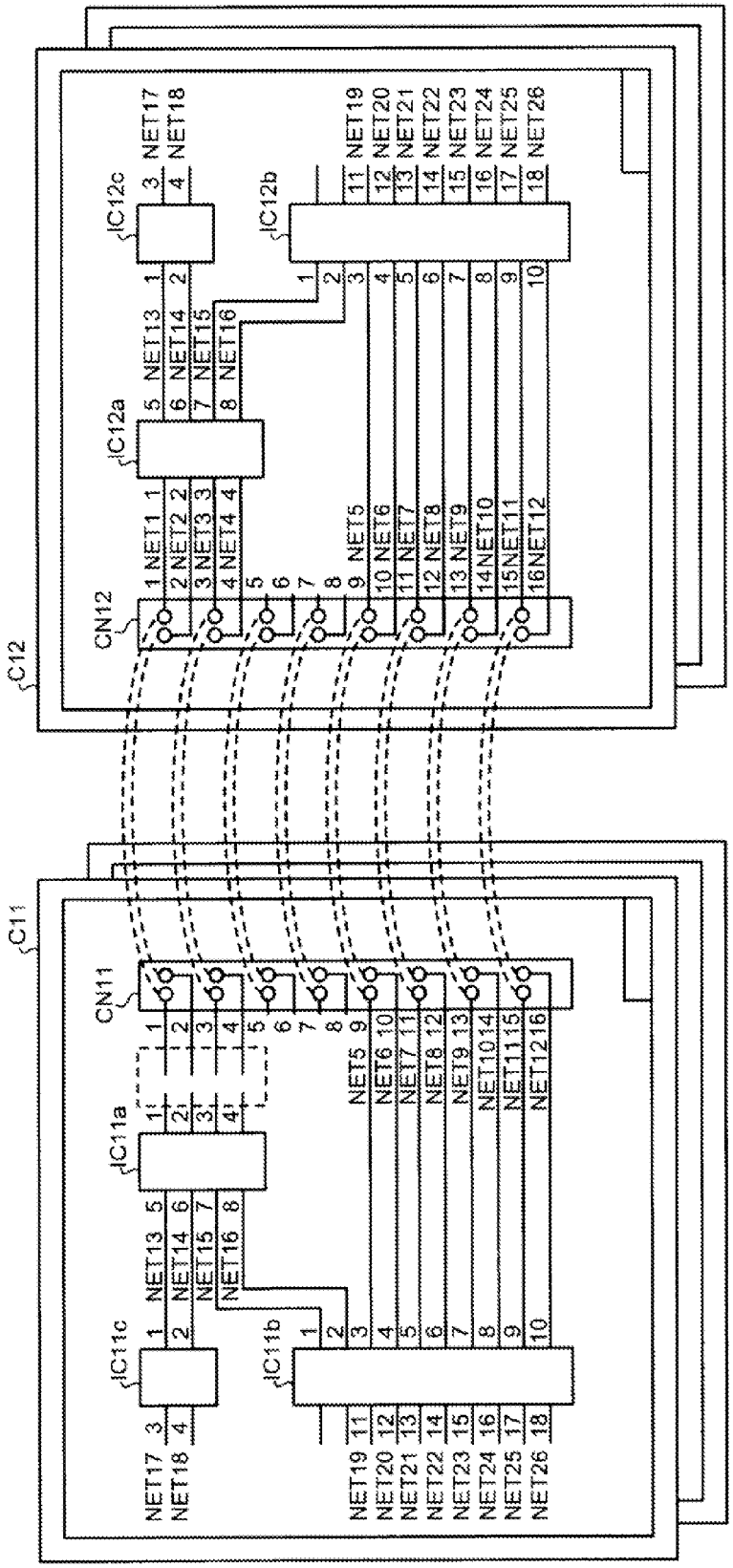
FIG. 12 is a diagram depicting an example of deletion of unnecessary nets (Part II)

FIG. 11 and FIG. 12 are diagrams depicting an example of deletion of unnecessary nets. More specifically, the converting unit 904 deletes from the net data 414 the connection destination net names NET1 to NET4 that have been set to terminals 1-4 of the component data IC11a. The converting unit 904 converts the descriptions of the net numbers 1 to 4 in the circuit component pin data 413 to "undefined". The "undefined" means 0 (zero).

As depicted in FIG. 12, the connection destination names NET1 to NET4 are deleted. In this way, unnecessary nets are deleted.

Figure 13:
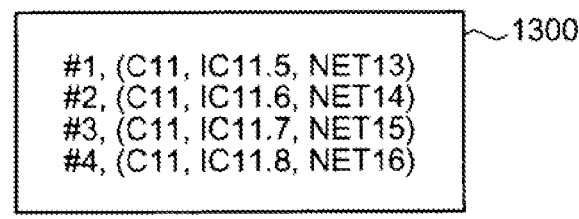
FIG. 13 is a diagram depicting an extraction result of other connection destination net names.

FIG. 13 is a diagram depicting an extraction result of other connection destination net names. Terminals of the component data IC11a that are unrelated to the first connector component data CN11 are terminals 5-8. The converting unit 904 extracts from the first board data C11 the connection destination net names NET13 to NET16 for terminals 5-8 of the component data IC11a. Other connection destination net names of the component data IC11a are NET13 to NET 16. The extraction result 1300 includes an identification number, board data, terminal number of component data, and a net name. The extraction result 1300 is stored in a storage device such as the ROM 202, the RAM 203, the magnetic disk 205, and the optical disk 207.

Figure 14:
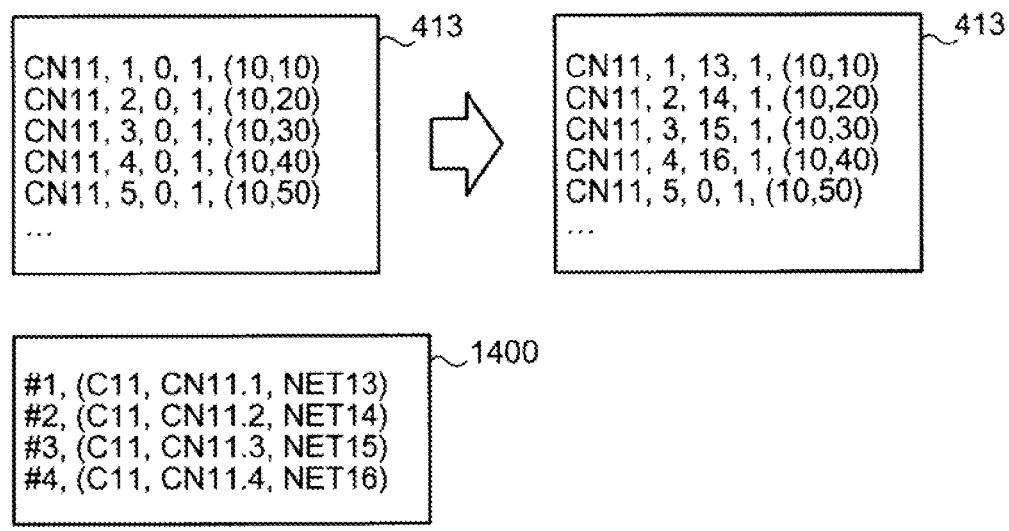
FIG. 14 is a diagram depicting an example of a conversion result (Part I)
Figure 15:
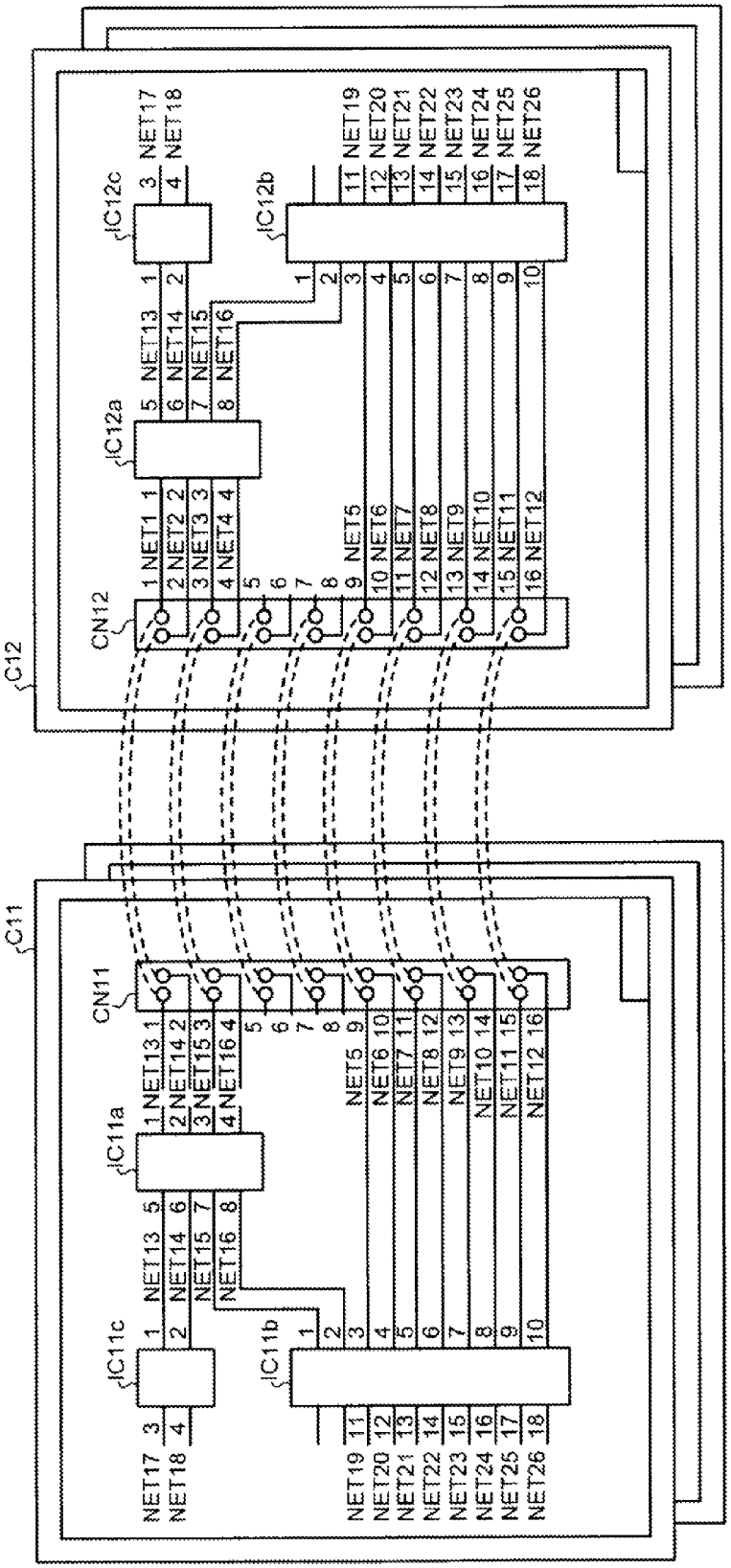
FIG. 15 is a diagram depicting an example of a conversion result (Part II)

FIG. 14 and FIG. 15 are diagrams depicting an example of a conversion result. The converting unit 904 sets the net names NET13 to NET15 in the extraction result 1300 to the connection destination net names of the first terminals in the circuit component pin data 413.

In FIG. 14, the number of terminals of the component data IC11a that are connected to the first connector component data CN11 is equal to the number of terminals of the component data IC11a that are not connected to the first connector component data CN11. Thus, the converting unit 904 can set the net names NET13 to NET15 to the connection destination net names of the first terminals.

If the number of terminals that are connected to the first connector component data CN11 is less than the number of terminals that are not connected to the first connector component data CN11, some of the terminals of the component data IC11a are left without a name. In this case, the converting unit 904 gives, to the terminals of the component data IC11a that are left without a name, connection destination net names of free terminals among terminals of the first connector component data CN11 that are not connected to the component data IC11a. If there are no sufficient free terminals, the converting unit 904 may add connector component data that connect the first board data C11 and the second board data C12. When the connector component data that indicate the connection relationship between board data are added, the converting unit 904 adds the connection relationship to the connection condition data 510.

The converting unit 904 outputs the relationship between the first terminals and the connection destination net names NET13 to NET15 as a setting result 1400. The setting result 1400 includes board data, the first terminals, and a net name. The setting result 1400 is stored in a storage apparatus such as the ROM 202, the RAM 203, the magnetic disk 205, and the optical disk 207.

In FIG. 15, terminals 1-4 of the first connector component data CN11 have NET13 to NET16.

The relocating unit 905 moves the component data IC11a from the first board data C11 to the second board data C12. More specifically, the relocating unit 905 deletes the component data IC11a from the first board data C11 and adds the component data IC11a to the second board data C12.

Figure 16:
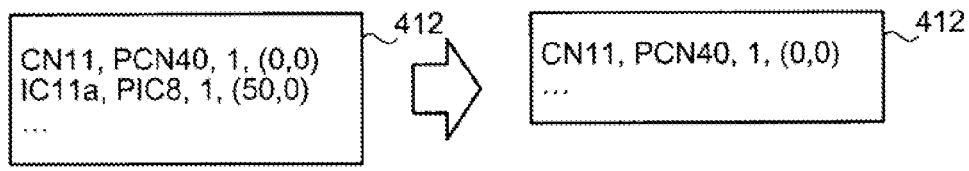

FIG. 16 is a diagram depicting an example of the deletion of the component data IC11a. The relocating unit 905 deletes the component data IC11a from the component data 412 in the first board data C11. Thus, the component data IC11a disappears from the first board data C11. The addition of the component data IC11a into the second board data C12 will be explained later.

The arranging unit 912 may draw interconnections as well as the deletion of the component data IC11a. For example, as depicted in FIG. 15, a net connected to the terminals 1, 2 of the first connector component data CN11 and a net connected to the terminals 1, 2 of the component data IC11c have the same net name but are apart. The arranging unit 912 adds a coupling terminal into the nets and connects the nets respectively that have the net names NET13 to NET16. The arranging unit 912 can add the coupling terminal in the first board data C11 by setting information on the coupling terminal data 416.

Figure 17:
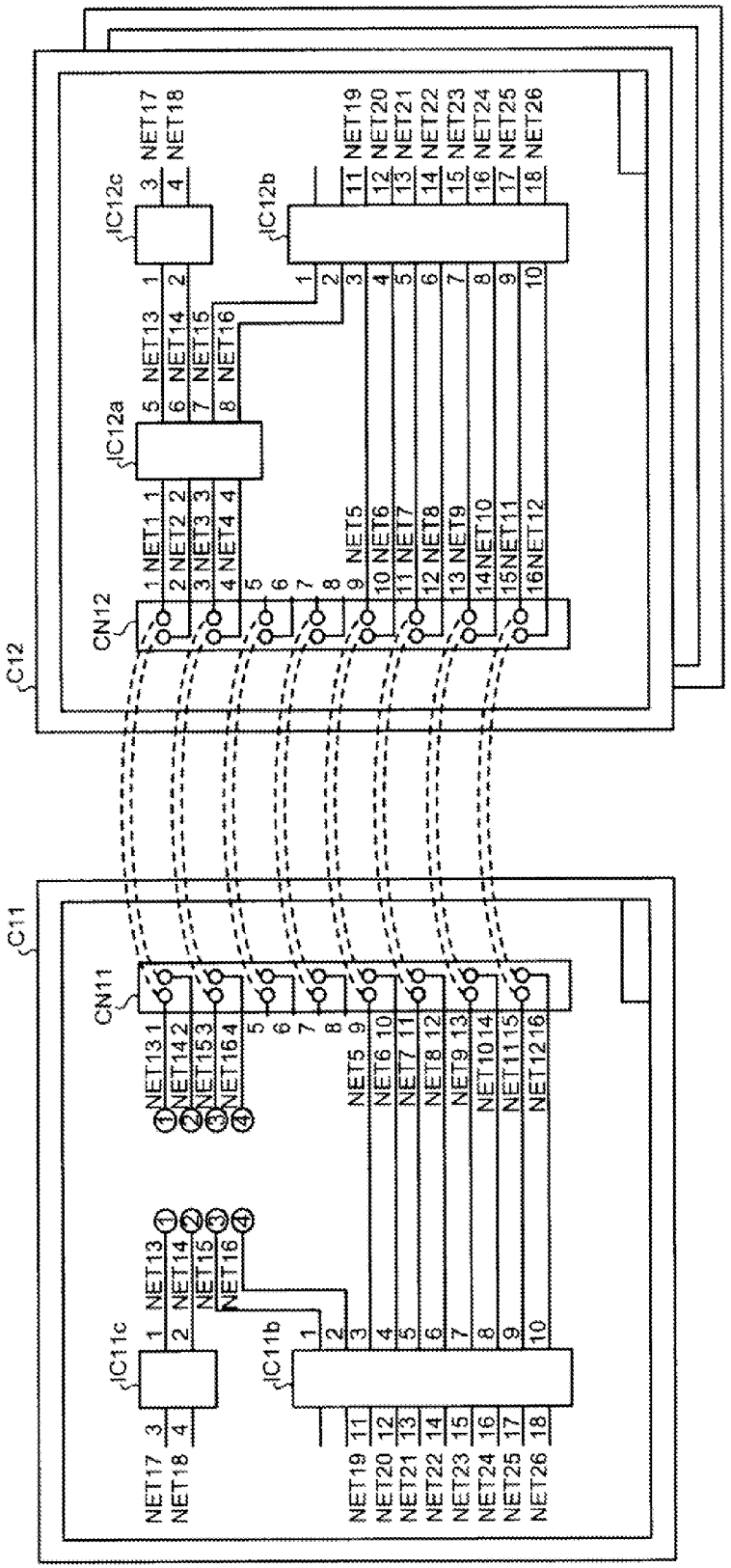
FIG. 17 is a diagram depicting an example of the addition of a coupling terminal into the first board data C11.

FIG. 17 is a diagram depicting an example of the addition of a coupling terminal into the first board data C11. In FIG. 17, encircled numerals 1 to 4 are given to coupling terminals. In FIG. 17, terminal 1 of the component data IC11c and terminal 1 of the first connector component data CN11 are connected when the coupling terminal 1 is set on the terminal 1 of the component data IC11c and the terminal 1 of the first connector component data CN11. When coupling terminal 2 is set on terminal 2 of the component data IC11c and terminal 2 of the first connector component data CN11, the terminal 2 of the component data IC11c and the terminal 2 of the first connector component data CN11 are connected.

When coupling terminal 3 is set on terminal 1 of the component data IC11b and terminal 3 of the first connector component data CN11, the terminal 1 of the component data IC11b and the terminal 3 of the first connector component data CN11 are connected. When coupling terminal 4 is set on terminal 2 of the component data IC11b and terminal 4 of the first connector component data CN11, the terminal 2 of the component data IC11b and the terminal 4 of the first connector component data CN11 are connected.

An embodiment where the first board data C11 is circuit diagram data is explained but when the first board data C11 is mounting design data, the arranging unit 912 may conduct an automatic arrangement by use of the CAD tool for the mounting design.

The first setting unit 906 gives a net name different from net names within the second board data C12 to the second terminals of the second connector component data CN12. As explained above, the second terminals of the second connector component data CN12 are terminals 1-4 of the second connector component data CN12. The processes of the first setting unit 906 will be explained in detail with reference to FIG. 18 to FIG. 20.

Figure 20:
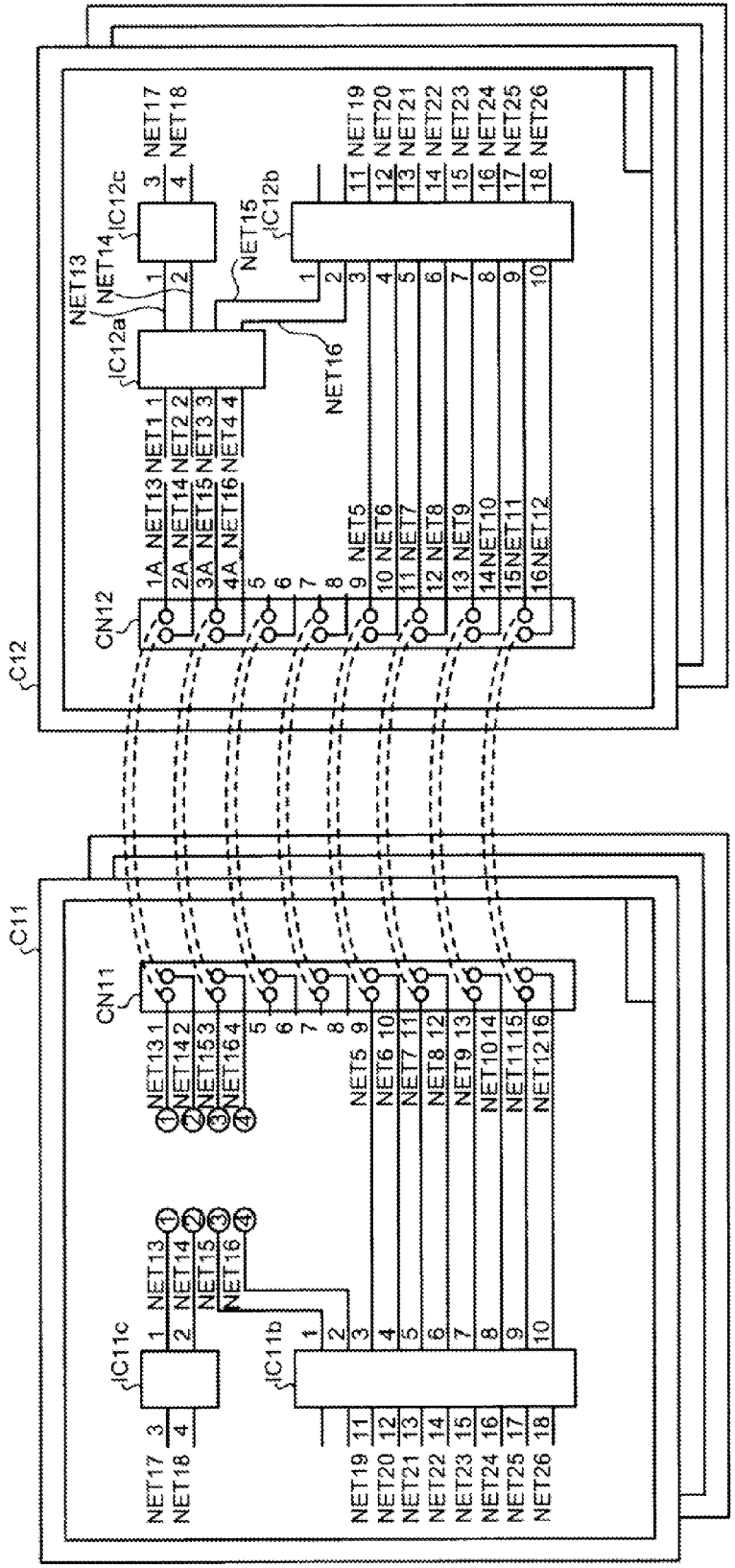
FIG. 20 is a diagram depicting an example of the labeling of the second terminals (Part III)

FIG. 18 to FIG. 20 are diagrams depicting an example of the labeling of the second terminals. The first setting unit 906 sets the net numbers "undefined", the net numbers representing the net names of the second terminals of the second component data CN12 in the result 1000 that is described in the data 423 included in the second board data C12. In FIG. 19, the fist setting unit 906 adds a net name included in the result 1400 into the net data 424 that is included in the second board data C12.

Since net names identical to the net names in the result 1400, NET13 to NET16, are present in the net data 424, the first setting unit 906 gives new net names different from those in the second board data C12. The first setting unit 906 alters net names NET13 to NET16 to A-NET13 to A-NET16 and adds the new names to the net data 424. The net numbers of net names A-NET13 to A-NET16 are 201 to 204 respectively.

The first setting unit 906 changes the net numbers of the second terminals of the second connector component data CN12 in the circuit component pin data 423 to the net names newly added to the net data 424.

In FIG. 20, A-NET 13 to A-NET16 are given to terminals 1-4 of the second connector component data CN12.

FIG. 21 is a diagram depicting an example of the addition of component data IC11a. The relocating unit 905 adds the component data IC11a to the second board data C12. More specifically, the relocating unit 905 adds the component data IC11a to the circuit component data 422. In this example, a name and a reference sign of each component data are identical and the name is given such that the duplicate name is avoided. When a name of the component data IC11a is present in the second board data C12, the relocating unit 905 changes the name of the component data IC11a.

The relocating unit 905 adds information concerning terminals of the component data IC11a that have been added to the circuit component data 422 to the circuit component pin data 423.

Figure 23:
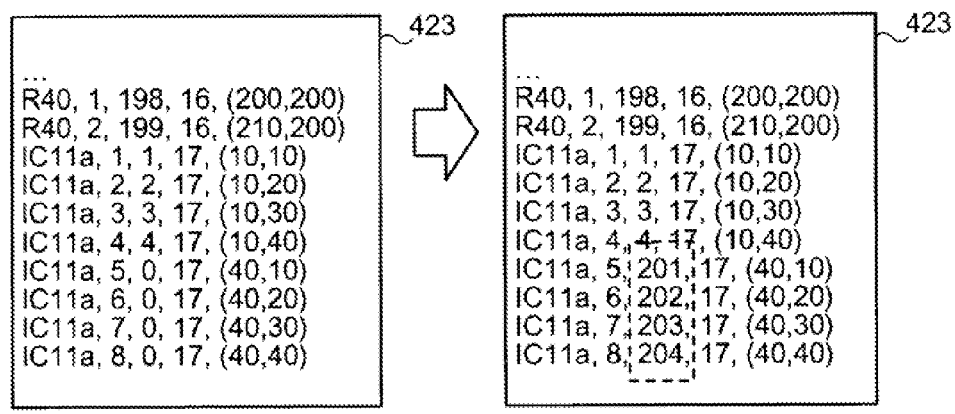
FIG. 23 is a diagram depicting net allocation to the relocated component data IC11a (Part II)
Figure 24:
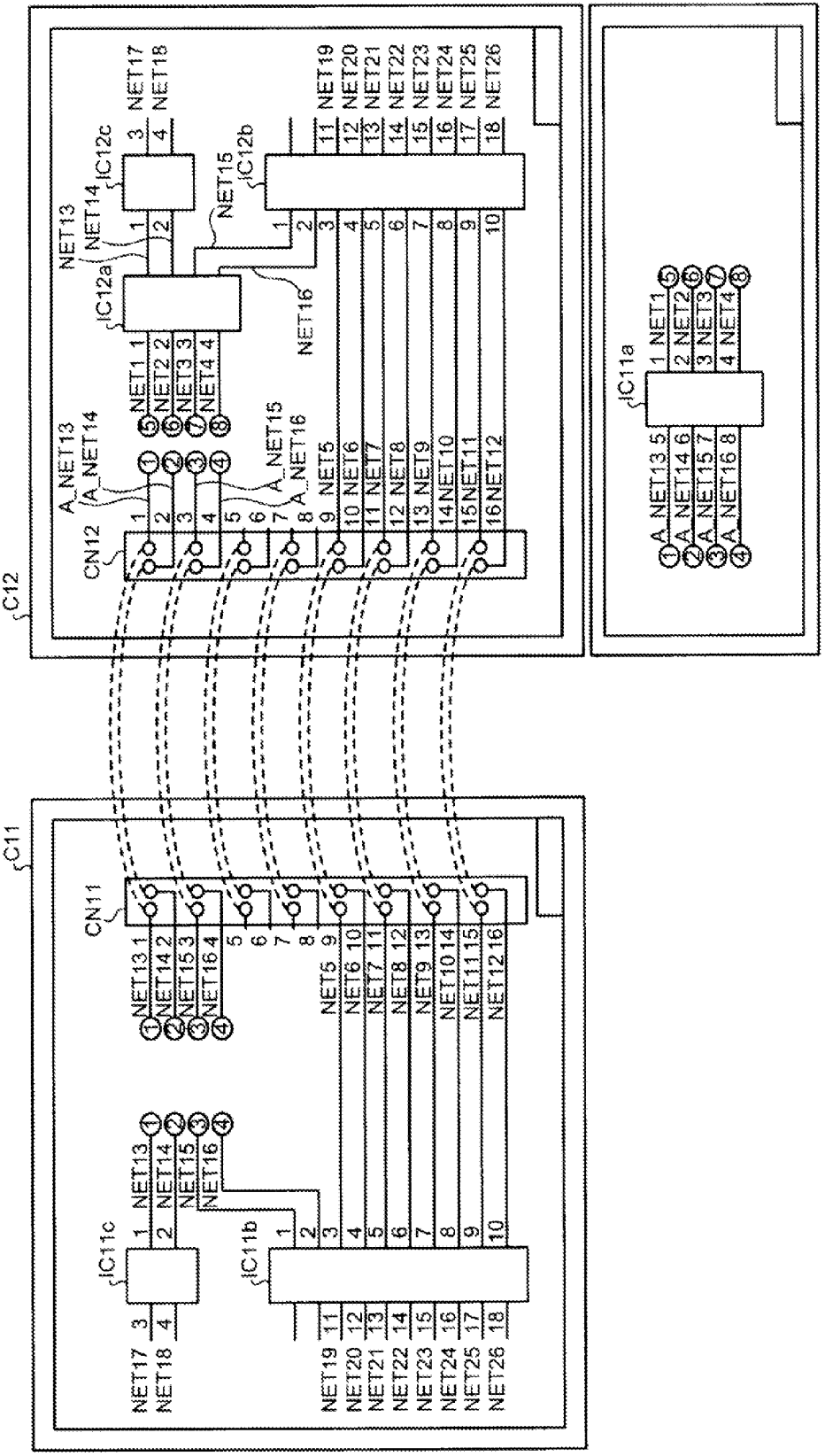
FIG. 24 is a diagram depicting net allocation to the relocated component data IC11a (Part III)

FIG. 22 to FIG. 24 are diagrams depicting net allocation to the relocated component data IC11a. After the relocating unit 905 moves the component data IC11a from the first board data C11 to the second board data C12, the second setting unit 907 rewrites a group of connection destination net names of the component data IC11a with the connection destination net names acquired by the acquiring unit 903. The group of connection destination net names of the component data IC11a indicates the connection destination net names of terminals 1-4 of the component data IC11a. In FIG. 22, the second setting unit 907 specifies among the net data 424 the net number representing the net name given to a terminal of the second connector component data CN12 included in the result 1000. The second setting unit 907 gives the specified net numbers to terminals 1-4 of the component data IC11a.

The second setting unit 907 gives the net names set by the first setting unit 906 to the other group of connection destination net names of the component data IC11a. The other group of connection destination net names is those of terminals 5-8 of the component data IC11a. The net names set by the first setting unit 906 are A-NET13, A-NET14, A-NET15, and A-NET16.

More specifically, the second setting unit 907 finds from the data 424 the net numbers representing the net names A-NET13 to A-NET16. Based on the result 1300, the second setting unit 907 specifies terminals 5-8 of the component data IC11a. The second setting unit 907 sets the net numbers 201 to 204 to the net numbers of terminals 5-8 of the component data IC11a.

In FIG. 24, the arranging unit 912 may arrange lines reflecting the addition of the component data IC11a. The second connector component data CN12 and the component data IC12a are set on a sheet different from one for the component data IC11a. Thus, a net connected to terminals 1-4 of the second component data CN12 and a net connected to terminals 5-8 of the component data IC11a have an identical name but are apart. A net connected to terminals of the component data IC12a and a net connected to terminals 1-4 of the component data IC11a have an identical name but are apart. The relocating unit 912 connects nets having an identical name by adding a coupling terminal to the second board data C12. Coupling terminals 1-8 are added to the second board data C12. The relocating unit 912 inputs a coupling terminal into the second board data C12 by setting information to the coupling terminal data 426.

The second board data C12 have been assumed to be circuit diagram data in this embodiment but when the second board data C12 are mounting design data, the relocating unit 912 may conduct an automatic arrangement by use of the CAD tool for the mounting design.

Processes for the third setting unit 908 and the fourth setting unit 911 are executed when any connection destination net name of terminals of the component data IC11a does not match that of terminals of the first connector component data CN11. The third setting unit 908, the relocating unit 909, the converting unit 910, and the fourth setting unit 911 work in the same way as explained in FIG. 1 and thus the detailed explanation thereof are omitted.

The circuit diagram data representing logical connections between components installed on a printed-circuit board correspond, one to one, to the mounting design data representing arrangement of components and wires installed on the printed-circuit board. Therefore, when component data is moved between mounting design data items, the designer has to reflect the changes to the circuit diagram data.

The circuit design apparatus 200 may store the history about the relocation in a storage device and reflect the change in the circuit diagram data when component data is moved between mounting design data items.

Figure 25:
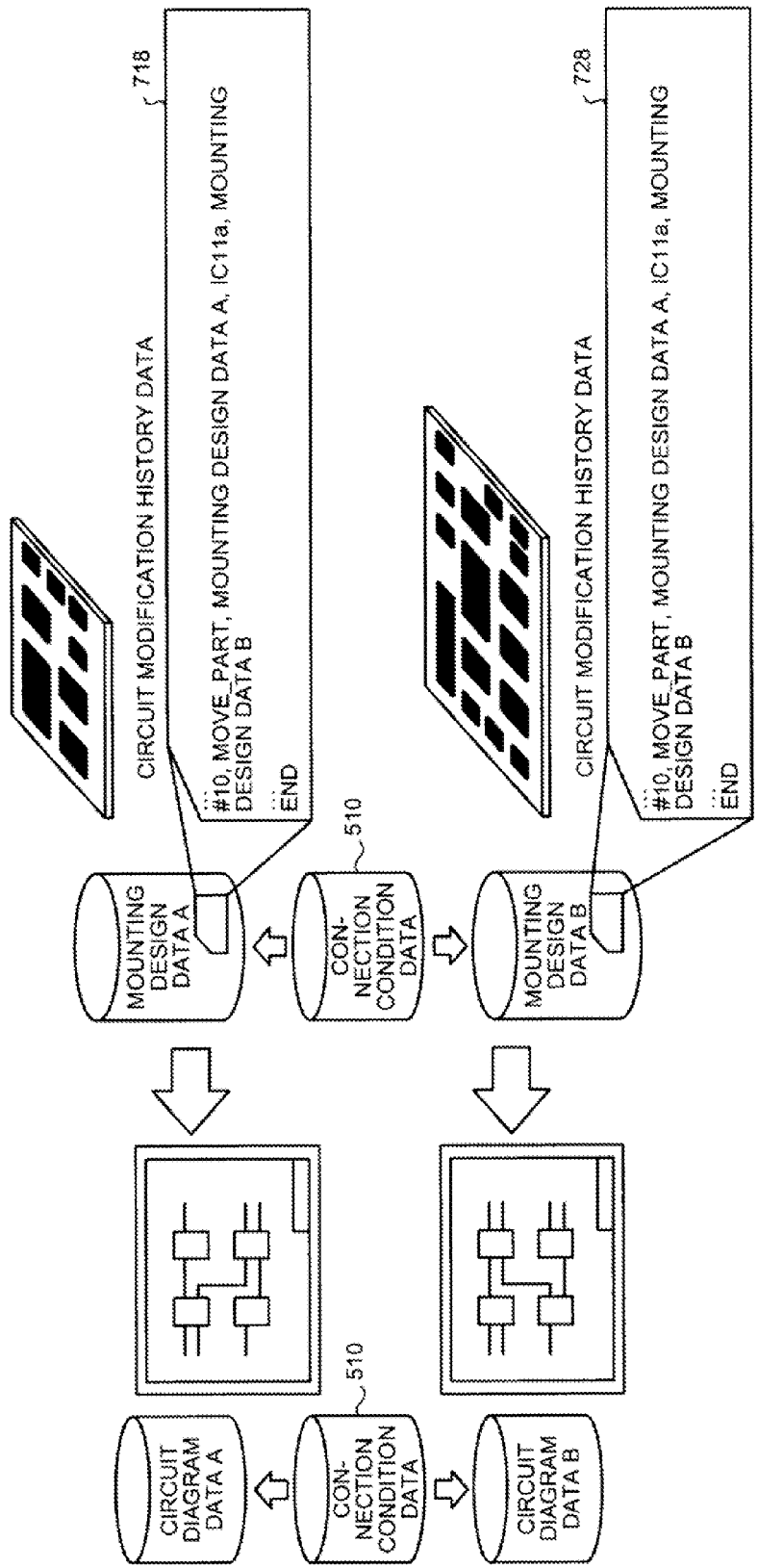
FIG. 25 is a diagram depicting an example of reflecting a result of the relocation of mounting component data on the circuit diagram data.

FIG. 25 is a diagram depicting an example of reflecting a result of the relocation of mounting component data on the circuit diagram data. In FIG. 25, the first board data C11, when mounting design data, is called mounting design data A and the second board data C12, when also mounting design data, is called mounting design data B. The first board data C11, when circuit diagram data, is called circuit diagram data A and the second board data C12, when circuit diagram data, is called circuit diagram data B.

After moving a component from the mounting design data A to the mounting design data B, the circuit design data 200 outputs the record of the component relocation to the circuit modification history data 718 and the circuit modification history data 728. For example, a set of "MOVE_PART, the mounting design data A, IC11a, and the mounting design data B" are recorded in the circuit modification history data 718 and the circuit modification history data 728. This record means "relocation instruction, source design data, component relocated, destination design data" and thus the circuit modification history data 718 and the circuit modification history data 728 indicate that IC11a has moved from the mounting design data A to the mounting design data B.

The circuit design apparatus 200, for example, acquires the circuit modification history data 718 of the mounting design data A and the circuit modification history data 728 of the mounting design data B. The circuit design apparatus 200 may, based on the circuit modification history data 718 and the circuit modification history data 728, move the component data IC11a from the circuit diagram data A to the circuit diagram data B by means of the selecting unit 901 to the relocating unit 912.

Figure 26:
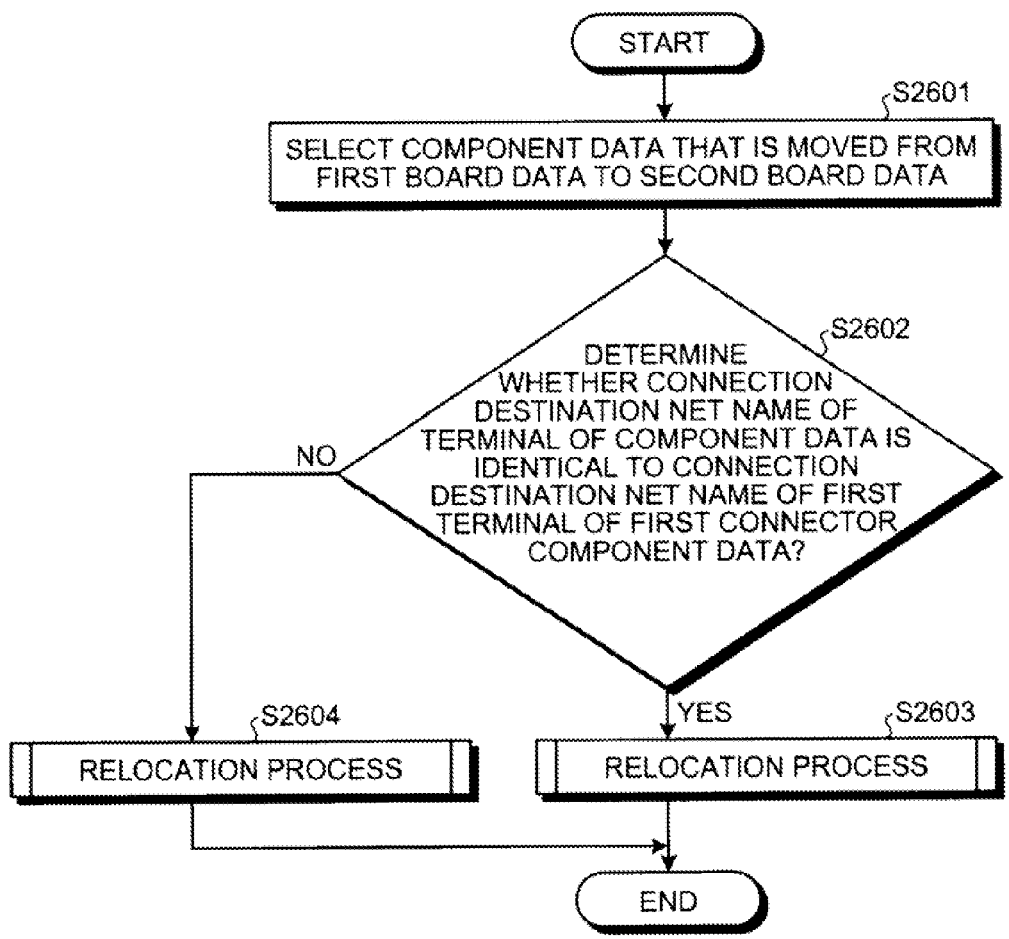
FIG. 26 is a flowchart depicting an example of a process executed by the circuit design apparatus 200.

FIG. 26 is a flowchart depicting an example of a process executed by the circuit design apparatus 200. The circuit design apparatus 200 selects, by means of the selecting unit 901, component data that is moved from the first board data to the second board data (step S2601). The circuit design apparatus 200 determines, by means of the determining unit 902, whether a connection destination net name of a terminal of the component data is identical to a connection destination net name of the first terminal of the first connector component data of the first board data (step S2602).

When the names are identical (step S2602: YES), the control goes to the step S2603. The circuit design apparatus 200 executes a relocation process (step S2603). After step S2603, the circuit design apparatus 200 ends the whole process.

When the names are not identical (step S2602: NO), the circuit design apparatus 200 executes a relocation process (step S2604). After step S2604, the circuit design apparatus 200 ends the whole process.

Figure 27:
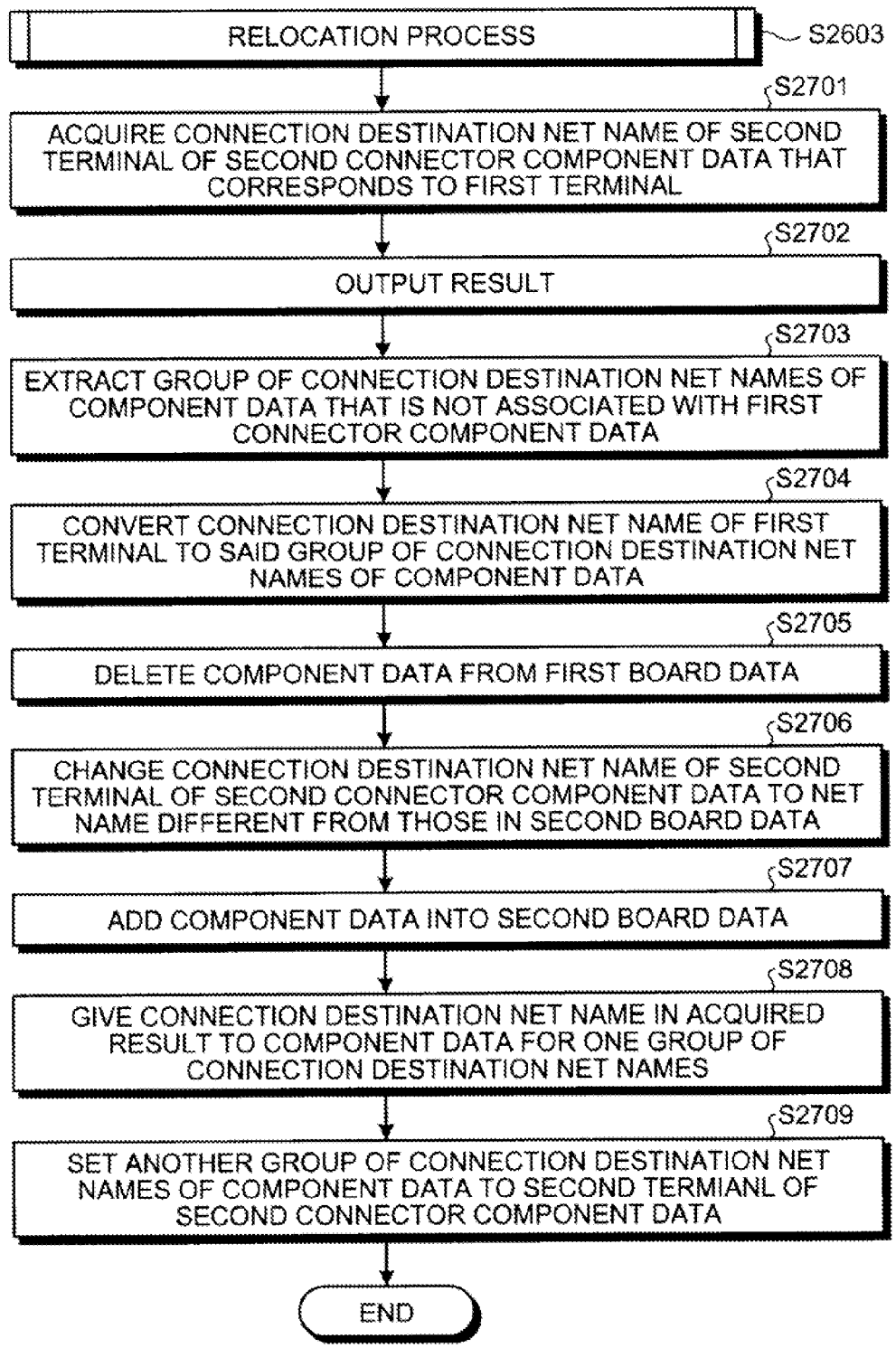
FIG. 27 is a flowchart of the relocation process (step S2603) of FIG. 26.

FIG. 27 is a flowchart of the relocation process (step S2603) of FIG. 26. The circuit design apparatus 200 executes the relocation process (step S2603) by means of the acquiring unit 903 to the second setting unit 907. For the detail of the acquiring unit 903 to the second setting unit 907, see FIG. 10 to FIG. 24.

The circuit design apparatus 200 acquires, by means of the acquiring unit 903, a connection destination net name of the second terminal of the second connector component data that corresponds to the first terminal (step S2701) and outputs a result (step S2702). An example of the output is the result 1000.

The circuit design apparatus 200 extracts, by means of the converting unit 904, another group of connection destination net names of component data that has no connection relationship with the first connector component data (step S2703). An example of extracted names is the result 1300. The circuit design apparatus 200 converts, by means of the converting unit 904, the connection destination net name of the first terminal to said another group of connection destination net name (step S2704). FIG. 14 depicts an example of the conversion.

The circuit design apparatus 200 deletes the component data from the first board data by means of the relocating unit 905 (step S2705). FIG. 16 depicts an example of the deletion. The arranging unit 912 may input a coupling terminal after the deletion of the component data as illustrated in FIG. 17.

The circuit design apparatus 200 changes, by means of the first setting unit 906, the connection destination net name of the second terminal to that different from net names in the second board data (step S2706). An example of this process is illustrated in FIG. 19. The circuit design apparatus 200 adds the component data into the second board data by means of the relocating unit 905 (step S2707). An example of the addition is illustrated in FIG. 21.

The circuit design apparatus 200 gives the connection destination net name in the result 1000 to the component data for one group of connection destination net names (step S2708). In FIG. 22, the net numbers representing the connection destination net names the terminals of the component data are replaced with the net numbers that represent the net names included in the result 1000.

The circuit design apparatus 200 sets, by the second setting unit 907, another group of connection destination net names of the component data to the second terminal of the second connector component data (step S2709) and ends the whole process. In FIG. 23, the net of the terminals that are not connected to the first connector component is set to the connection destination net name set by the first setting unit 906. In FIG. 24, the arranging unit 912 may input a coupling terminal into the second board data after the setting process of the second setting unit 907.

FIG. 28 is a flowchart of the relocation process (step S2604) of FIG. 26. The circuit design apparatus 200 executes the relocation process (step S2604) by means of the third setting unit 908 to the fourth setting unit 911. The detail of the third setting unit 908 to the fourth setting unit 911 has been explained in FIG. 1. Thus, the relocation process (step S2604) is explained showing the correspondence with FIG. 1.

The circuit design apparatus 200 extracts, by means of the third setting unit 908, a connection destination net name of each terminal of the component data (step S2801). The component data corresponds to the component data IC1b in FIG. 1. Thus, NET5, NET6, NET9, and NET10 set to terminals 1-4 of the component data IC1b are extracted.

The circuit design apparatus 200 sets, by means of the third setting unit 908, the extracted connection destination net name to the vacant terminal of the first connector component data (step S2802). In FIG. 1, terminal 5 of the first connector component data CN1 receives NET5, terminal 6 NET6, terminal 7 NET9, and terminal 8 NET10.

The circuit design apparatus 200 deletes, by means of the relocating unit 909, the component data from the first board data (step S2803). The arranging unit 912 may input a coupling terminal after the deletion of the component data by the relocating unit 909.

The circuit design apparatus 200 adds the component data to the second board data by means of the relocating unit 909 (step S2804). When component data having a name identical to that of the component data of interest is present in the second board data, the circuit design apparatus 200 changes the name of the component data of interest to a new one in the second board data and adds the component data of interest into the second board data.

The circuit design apparatus 200 converts, by means of the converting unit 910, the connection destination net name of the component data into a new net name in the second board data (step S2805). In FIG. 1, since net names NET5 and NET6 are present in the second board data, net names are converted to A-NET5 and A-NET6 respectively. In FIG. 1, net names NET9 and NET10 are not used in the second board data, these names are converted.

The circuit design apparatus 200 sets, by means of the fourth setting unit 911, the converted names to the vacant terminals of the second connector component data that correspond to the vacant terminal of the first connector component data (step S2806). The apparatus 200 terminates the entire process. The relocating unit 912 may input a coupling terminal to the second board data after the process of the fourth setting unit 911.

As explained above, when component data is moved from the first board data to the second board data, the circuit design apparatus gives a net name of the component data to a vacant terminal of the first connector component. The circuit design apparatus a net name of the relocated component data to a vacant terminal of the second connector component that corresponds to the vacant terminal of the first connector component. In this way, the circuit design component can maintain the logical relationship between a pair of circuit board data. Accordingly, a user is released from the time-consuming work.

There could be a net name in the second board data identical to a net name of component data when the component data is moved from the first board data to the second board data. In this case, the circuit design apparatus changes the net name of the component data to a new name in the second board data. The circuit design apparatus gives the converted net name to a vacant terminal of the second connector component that corresponds to a vacant terminal of the first connector component. In this way, the identical net names are not given and the circuit design apparatus can maintain the relationship between a pair of board data. Accordingly, a user is released from the time-consuming work.

When a component is connected to the first connector component, the component is connected to the second connector component via the first connector component. The circuit design apparatus obtains a connection destination net name set to a terminal of the second connector component that corresponds to a terminal of the first connector component data to which the component is connected. After the component data is moved, the circuit design apparatus sets the obtained name to a terminal of the component data. In this way, the circuit design apparatus can maintain the relationship between a pair of board data even after the component data is relocated. Accordingly, a user is released from the time-consuming work.

The circuit design apparatus automatically checks whether the component data is connected to the second connector component via the first connector component and takes an appropriate action for the check result. In this way, the circuit design apparatus can maintain the relationship between a pair of circuit board data such that a designer does not have to care about whether the component data is connected to the second connector component via the first connector component. Accordingly, a user does not have to set or delete a net at the relocation of component data, thereby improving design efficiency.

The circuit design method described in the present embodiments may be implemented by executing a prepared program on a computer such as a personal computer and a workstation. The destination determining program is stored on a computer-readable recording medium such as a hard disk, a flexible disk, a CD-ROM, an MO, and a DVD, read out from the recording medium, and executed by the computer. The program may be distributed through a network such as the Internet. However, the computer-readable recording medium does not include a transitory medium such as a propagation signal.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A computer-readable recording medium storing a program that causes a computer to execute a circuit design process comprising:
   selecting component data in first board data from among the first board data including first connector component data and second board data including second connector component data that is associated with the first connector component data;
   acquiring, when a first connection destination net name of the selected component data is identical to a connection destination net name of a first terminal of the first connector component data, a connection destination net name for a second terminal of the second connector component data that corresponds to the first terminal;
   converting the connection destination net name of the first terminal to a second connection destination net name of the component data that is not associated with the first connector component data;

setting the connection destination net name of the second terminal of the second connector component data to a net name different from a net name within the second board data; and setting, when the component data is moved from the first board data to the second board data, the acquired connection destination net name to the first connection destination net name of the component data, and setting the net name given to the second terminal to the second connection destination net name of the component data.

2. The computer-readable recording medium according to claim 1, the process further comprising determining whether the first connection destination net name of the component data is identical to the connection destination net name of the first terminal of the first connector component data, wherein in the acquiring, the connection destination name of the second terminal is acquired when the first connection destination net name is identical to the connection destination net name of the first terminal.

3. The computer-readable recording medium according to claim 2, wherein the connection destination net name of the selected component data is set to the first vacant terminal of the first connector component data when the first connection destination net name is not identical to the connection destination net name of the first terminal, and the connection destination net name of the component data is set to the connection destination net name of the second vacant terminal of the second connector component data that corresponds to the first vacant terminal of the first connector component data.

4. A circuit design method executed by a computer, the method comprising:

selecting, by using the computer, component data in first board data from among the first board data including first connector component data and second board data including second connector component data that is associated with the first connector component data;

acquiring, when a first connection destination net name of the selected component data is identical to a connection destination net name of a first terminal of the first connector component data, a connection destination net name for a second terminal of the second connector component data that corresponds to the first terminal;

converting the connection destination net name of the first terminal to a second connection destination net name of the component data that is not associated with the first connector component data;

setting the connection destination net name of the second terminal of the second connector component data to a net name different from a net name within the second board data; and setting, when the component data is moved from the first board data to the second board data, the acquired connection destination net name to the first connection destination net name of the component data, and setting the net name given to the second terminal to the second connection destination net name of the component data.

5. A circuit design apparatus, comprising:

a processor configured to:

select component data in first board data from among the first board data including first connector component data and second board data including second connector component data that is associated with the first connector component data, acquire, when a first connection destination net name of the selected component data is identical to a connection destination net name of a first terminal of the first connector component data, a connection destination net name for a second terminal of the second connector component data that corresponds to the first terminal, convert the connection destination net name of the first terminal to a second connection destination net name of the component data that is not associated with the first connector component data, set the connection destination net name of the second terminal of the second connector component data to a net name different from a net name within the second board data, and set, when the component data is moved from the first board data to the second board data, the acquired connection destination net name to the first connection destination net name of the component data, and setting the net name given to the second terminal to the second connection destination net name of the component data.

* * * * *